(12) United States Patent
Park et al.

(10) Patent No.: US 9,208,713 B2
(45) Date of Patent: Dec. 8, 2015

(54) PIXELS GROUP AND DISPLAY PANEL HAVING THE SAME

(71) Applicant: Samsung Display Co., Ltd., Yongin, Gyeonggi-Do (KR)

(72) Inventors: Sung-Jae Park, Wonju-si (KR); Se-Ah Kwon, Seoul (KR); Ki-Soo Park, Seoul (KR); Ik-Soo Lee, Seoul (KR); Jong-Hak Hwang, Yongin-si (KR)

(73) Assignee: Samsung Display Co., Ltd. (KR)

( * ) Notice: Subject to any disclaimer, the term of this patent is extended or adjusted under 35 U.S.C. 154(b) by 265 days.

(21) Appl. No.: 13/843,294

(22) Filed: Mar. 15, 2013

(65) Prior Publication Data

US 2014/0055330 A1 Feb. 27, 2014

(30) Foreign Application Priority Data

Aug. 24, 2012 (KR) .................. 10-2012-0093107

(51) Int. Cl.
  *G09G 3/36* (2006.01)
  *G09G 3/20* (2006.01)
  *G09G 3/32* (2006.01)
  *H01L 27/32* (2006.01)

(52) U.S. Cl.
  CPC ............ *G09G 3/2003* (2013.01); *G09G 3/3208* (2013.01); *H01L 27/322* (2013.01); *H01L 27/3218* (2013.01); *G02F 2201/52* (2013.01); *G09G 2300/0452* (2013.01)

(58) Field of Classification Search
  CPC .. G09G 3/2003; G09G 3/3208; H01L 27/322; H01L 27/3218
  USPC ............................................................ 345/88
  See application file for complete search history.

(56) References Cited

U.S. PATENT DOCUMENTS

| 7,268,757 | B2 | 9/2007 | Ben-David et al. | |
| 8,451,302 | B2 * | 5/2013 | Yoshida et al. | 345/694 |
| 2007/0268205 | A1 | 11/2007 | Sasaguri | |
| 2007/0268208 | A1 * | 11/2007 | Okada et al. | 345/55 |
| 2008/0079867 | A1 * | 4/2008 | Ham | 349/62 |
| 2009/0002298 | A1 * | 1/2009 | Furukawa | 345/88 |
| 2010/0066956 | A1 * | 3/2010 | Nakamura et al. | 349/108 |
| 2010/0265283 | A1 | 10/2010 | Langendijk et al. | |
| 2011/0187628 | A1 | 8/2011 | Okada et al. | |

* cited by examiner

*Primary Examiner* — Kwang-Su Yang
(74) *Attorney, Agent, or Firm* — Innovation Counsel LLP

(57) ABSTRACT

A pixels group includes first to fourth pixels disposed in a 2*2 matrix. Each of the first to fourth pixels includes first to third sub-pixels. Each of the first sub-pixels of first to fourth pixels has a first color. The second sub-pixel of first pixel and the second sub-pixel of fourth pixel have a second color. The third sub-pixel of first pixel and the third sub-pixel of fourth pixel have a third color. The second sub-pixel of second pixel and the second sub-pixel of third pixel have a fourth color. The third sub-pixel of second pixel and the third sub-pixel of third pixel has a fifth color.

15 Claims, 18 Drawing Sheets

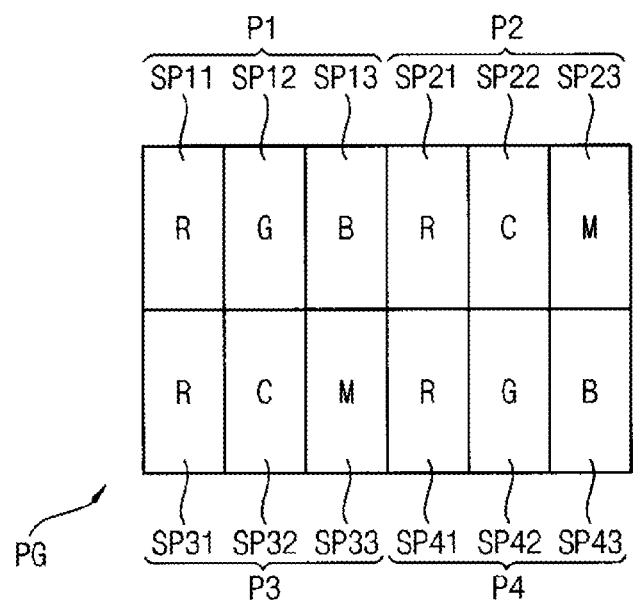

FIG. 1C

| B | G | R | C | Y | R |
|---|---|---|---|---|---|
| C | Y | R | B | G | R |

FIG. 1D

| G | R | B | G | Y | C |
|---|---|---|---|---|---|
| G | Y | C | G | R | B |

FIG. 1E

| B | G | R | M | G | Y |
|---|---|---|---|---|---|
| M | G | Y | B | G | R |

FIG. 1F

| R | B | G | M | C | G |
|---|---|---|---|---|---|
| M | C | G | R | B | G |

FIG. 1G

| B | R | G | B | C | Y |
|---|---|---|---|---|---|
| B | C | Y | B | R | G |

FIG. 1H

| R | B | G | C | B | Y |
|---|---|---|---|---|---|
| C | B | Y | R | B | G |

FIG. 1I

| R | G | B | M | Y | B |
|---|---|---|---|---|---|
| M | Y | B | R | G | B |

FIG. 1J

| B | G | R | B | Y | R |
|---|---|---|---|---|---|
| B | Y | R | B | G | R |

FIG. 1K

| R | B | G | R | B | Y |
|---|---|---|---|---|---|
| R | B | Y | R | B | G |

FIG. 1L

| R | G | B | R | C | B |
|---|---|---|---|---|---|
| R | C | B | R | G | B |

FIG. 1M

| G | R | B | G | M | B |
|---|---|---|---|---|---|
| G | M | B | G | R | B |

FIG. 1N

| B | G | R | B | G | Y |
|---|---|---|---|---|---|
| B | G | Y | B | G | R |

FIG. 10

| R | G | B | Y | G | B |
|---|---|---|---|---|---|
| Y | G | B | R | G | B |

FIG. 2A

| SP11 | SP12 | SP13 | SP14 | SP21 | SP22 | SP23 | SP24 |
|------|------|------|------|------|------|------|------|
| R | G | B | Y | R | C | B | Y |
| R | C | B | Y | R | G | B | Y |
| SP31 | SP32 | SP33 | SP34 | SP41 | SP42 | SP43 | SP44 |

| B | R | G | C | B | Y | G | C |
|---|---|---|---|---|---|---|---|
| B | Y | G | C | B | R | G | C |

FIG. 2C

| R | B | G | Y | R | C | M | Y |
|---|---|---|---|---|---|---|---|
| R | C | M | Y | R | B | G | Y |

FIG. 2D

| R | G | Y | B | R | C | M | B |
|---|---|---|---|---|---|---|---|
| R | C | M | B | R | G | Y | B |

FIG. 2E

| G | R | C | B | G | Y | M | B |
|---|---|---|---|---|---|---|---|
| G | Y | M | B | G | R | C | B |

PIXELS GROUP AND DISPLAY PANEL HAVING THE SAME

CROSS-REFERENCE TO RELATED APPLICATION

This application claims priority to Korean Patent Application No. 10-2012-0093107, filed on Aug. 24, 2012, and all the benefits accruing therefrom under 35 U.S.C. §119, the contents of which application are incorporated by reference herein in their entireties.

BACKGROUND

1. Field of Disclosure

The present disclosure of invention relates to a pixels group and a display panel having the pixels group populating its display area.

More particularly, example embodiments of the present invention relate to a pixels group using multi primary colors and a display panel having the pixels group.

2. Discussion of Related Technology

Generally, as an example of color display devices, a display apparatus includes a display panel such as a liquid crystal display panel and an organic light emit diode (OLED) display panel. The display panel includes an array substrate, an opposite substrate and a liquid crystal layer. The array substrate includes a plurality of data lines, a plurality of gate lines, a plurality of switching elements, and a plurality of pixel electrodes. The opposite substrate includes a plurality of color filters and a plurality of common electrodes corresponding to the pixel electrodes. The color filters may be included in the array substrate instead of the opposite substrate. The liquid crystal layer is interposed between the array substrate and the color filter substrate. The color filter typically has red, blue and green colored filters so that, with different weighted combinations of these three primary colors a variety of non-primary colors may be displayed.

Recently, it has become vogue to form liquid crystal display apparatuses using a multi primary colors scheme of more than just three primary colors, for example a scheme in which further primary colors such as Yellow (Y), Magenta (M), Cyan (C) and etc, has been included in addition to the traditional three, Red (R), Green (G) and Blue (B) so as to improve resolution and brightness. However, liquid crystal display apparatuses using multi primary color can have a poor display quality problem due to perception by the human visual system of visible criss-cross stripes in specific colors developing across such displays. These artifacts are not generally seen in traditional RGB vertical stripe schemes and yet they can become pronounced when subpixels of the further primary colors are placed close together.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

Example embodiments in accordance with the present disclosure of invention provide a display device having a display area (DA) which is tessellated by a pixels group (PG) where the subpixels of the pixels group are configured for providing an improved display quality. More specifically, it has been found acceptable, in one embodiment, to keep the red (R—as an example) colored subpixels of a multi-primary pixels group (PG) vertically adjacent to one another so as to form first-colored vertical stripes that are spaced apart from one another, but advisable at the same time to keep the further primary colors such as Yellow (Y), Magenta (M), Cyan (C) and etc horizontally and vertically spaced apart from one another, for example, by at least two columns in the horizontal direction so as to avoid or reduce the criss-cross artifacts from being perceived by the human visual system. Yet more specifically, in accordance with the present disclosure, mixtures of spaced apart vertical stripes of first colored (e.g., red (R)) subpixels are intermixed with checkerboard patterns of other, differently colored subpixels (e.g., G, B, C, M in the case of below described FIG. 1) so as to break apart the tendency of the human visual system to recognize criss-cross artifacts. A variety of different configurations of spaced apart vertical stripes and interposed checkerboard patterns are disclosed herein.

According to one example embodiment in accordance with the present disclosure, a pixels group (PG) includes first to fourth pixels disposed in a 2 pixels-by-2 pixels matrix. Each of the first to fourth pixels includes first to third sub-pixels. Each of the first sub-pixels of first to fourth pixels has a first color. The second sub-pixel of first pixel and the second sub-pixel of fourth pixel have a second color. The third sub-pixel of first pixel and the third sub-pixel of fourth pixel have a third color. The second sub-pixel of second pixel and the second sub-pixel of third pixel have a fourth color. The third sub-pixel of second pixel and the third sub-pixel of third pixel has a fifth color.

In an example embodiment, the first to fifth colors may be one of red, green, blue, cyan, yellow and magenta. The first to fifth colors may be different from each other.

In an example embodiment, the first color may be red.

In an example embodiment, the first to third sub pixels of first to fourth pixels may be sequentially disposed.

In an example embodiment, the first to fifth colors may be one of red, green, blue, cyan, yellow and magenta. The second color and the fourth color may be same.

In an example embodiment, the second color and the fifth color may be different from each other. The third color and the fourth color are different from each other.

In an example embodiment, the first to fifth colors may be one of red, green, blue, cyan, yellow and magenta. The third color and the fifth color may be same.

In an example embodiment, the first color may be red, and the third color and the fifth color may be blue.

In an example embodiment, at least two of the sub-pixels among the first to third sub-pixels of first to fourth pixels, may have different size of area that light passes.

According to an example embodiment of the invention, a pixels group (PG) includes first to fourth pixels disposed in a 2*2 matrix. Each of the first to fourth pixels comprising first to fourth sub-pixels. Each of the first sub-pixels of first to fourth pixels has a first color. The second sub-pixel of first pixel and the second sub-pixel of fourth pixel have a second color. The third sub-pixel of first pixel and the third sub-pixel of fourth pixel have a third color. The second sub-pixel of second pixel and the second sub-pixel of third pixel have a fourth color. The third sub-pixel of second pixel and the third sub-pixel of third pixel have a fifth color. Each of the fourth sub-pixels of first to fourth pixels has a sixth color.

In an example embodiment, the first to sixth colors may be one of red, green, blue, cyan, yellow and magenta. The first to fifth colors may be different from each other.

In an example embodiment, the first color may be red, and the sixth color is blue.

In an example embodiment, the first to fourth sub pixels of first to fourth pixels may be sequentially disposed.

In an example embodiment, the first to sixth colors may be one of red, green, blue, cyan, yellow and magenta. The second color and the fourth color may be same.

According to an example embodiment of the present disclosure of invention, a display panel includes an array substrate including a first substrate and a thin film transistor disposed on the first substrate, an opposite substrate comprising a second substrate, color filters disposed under the second substrate and having first to fifth colors, and a black matrix disposed between the color filters to compart a pixels group (PG). The color filters are disposed corresponding to the pixels group. The pixels group includes first to fourth pixels disposed in a 2*2 matrix. Each of the first to fourth pixels includes first to third sub-pixels. Each of the first sub-pixels of first to fourth pixels has a first color. The second sub-pixel of first pixel and the second sub-pixel of fourth pixel have a second color. The third sub-pixel of first pixel and the third sub-pixel of fourth pixel have a third color. The second sub-pixel of second pixel and the second sub-pixel of third pixel have a fourth color. The third sub-pixel of second pixel and the third sub-pixel of third pixel has a fifth color.

In an example embodiment, the first to fifth colors may be one of red, green, blue, cyan, yellow and magenta. The first to fifth colors are different from each other.

In an example embodiment, the black matrix may partially overlap with adjacent color filter. A size that the black matrix overlaps with the color filter may be different according to color of the color filter.

In an example embodiment, the first to fifth colors may be one of red, green, blue, cyan, yellow and magenta, the first to fifth colors are different from each other. Each size of area that light passes of the each color filter may be different according to color of the color filter.

In an example embodiment, the ratio of the size of the area that light passes of the color filters red:green:blue:cyan:yellow may be about 0.75:0.5:0.8:0.5:0.45.

In an example embodiment, the first to fifth colors may be one of red, green, blue and yellow. Ratio of size of area that light passes of the color filters red: green: blue: yellow may be about 1.6:1:1.6:1.

According to the example embodiments of the present disclosure of invention, a repeated pixels group includes an even number of sub-pixels of each color. Although a plurality of pixels groups is continuously disposed, the sub-pixels having same color are disposed in different rows and spaced apart by 2 columns, so that the sub-pixels having same color are adjacently disposed in same column, or are spaced apart in farthest position. Thus, cross stripes are less visible, so that displaying quality may be improved.

In addition to the color arrangement of the PRU, color displaying quality may be further improved by controlling a size of area of color filter of each of sub-pixels that light passes.

BRIEF DESCRIPTION OF THE DRAWINGS

The above and other features of the present disclosure of invention will become more apparent by describing in detail example embodiments thereof with reference to the accompanying drawings, in which:

FIGS. 1A to 1O are conceptual diagrams illustrating color arrangement of corresponding pixels groups according to respective embodiments of the present disclosure;

FIGS. 2A to 2E are conceptual diagrams illustrating color arrangement of corresponding pixels groups according to respective other example embodiment of the disclosure;

DETAILED DESCRIPTION

Figure 3A:
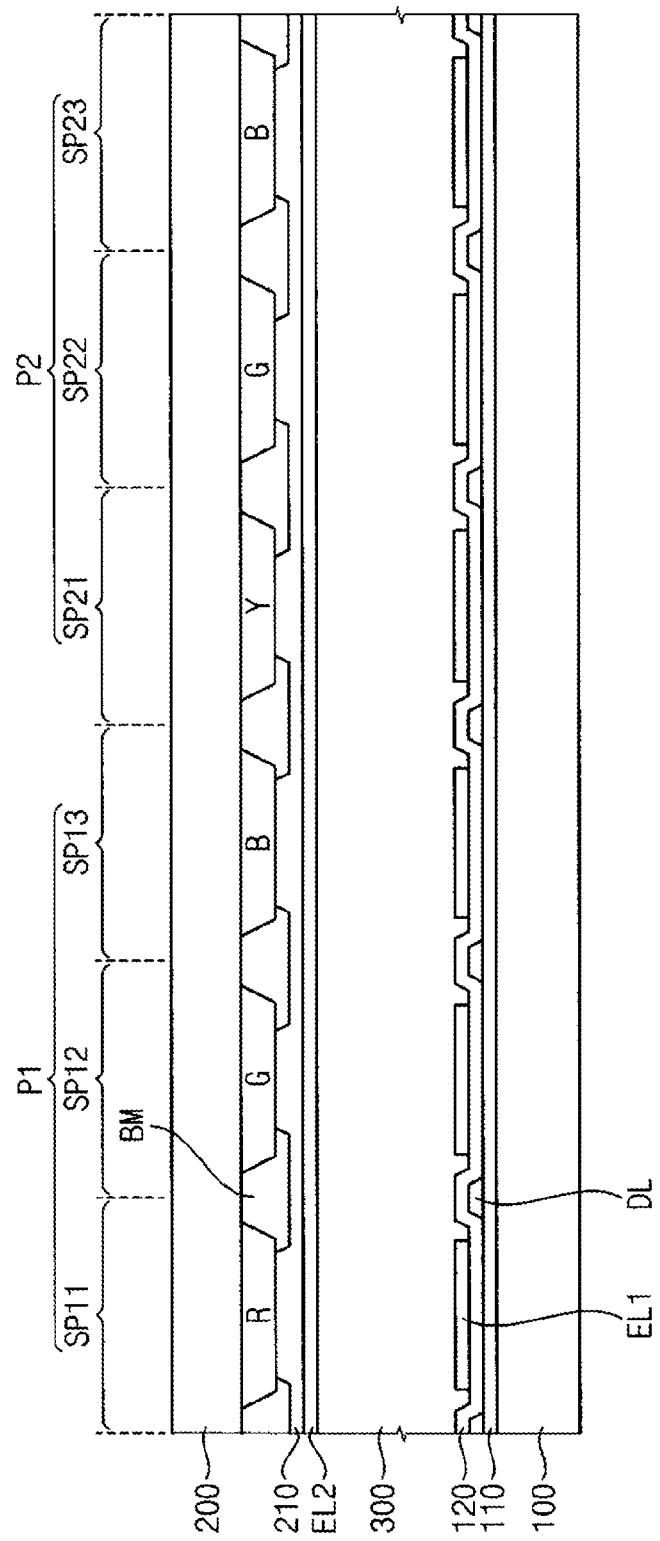
FIG. 3A is a cross-sectional view illustrating a first row of the pixels group of FIG. 1O.

Hereinafter, the present disclosure of invention will be explained in detail with reference to the accompanying drawings.

Figures 1C, 1D:
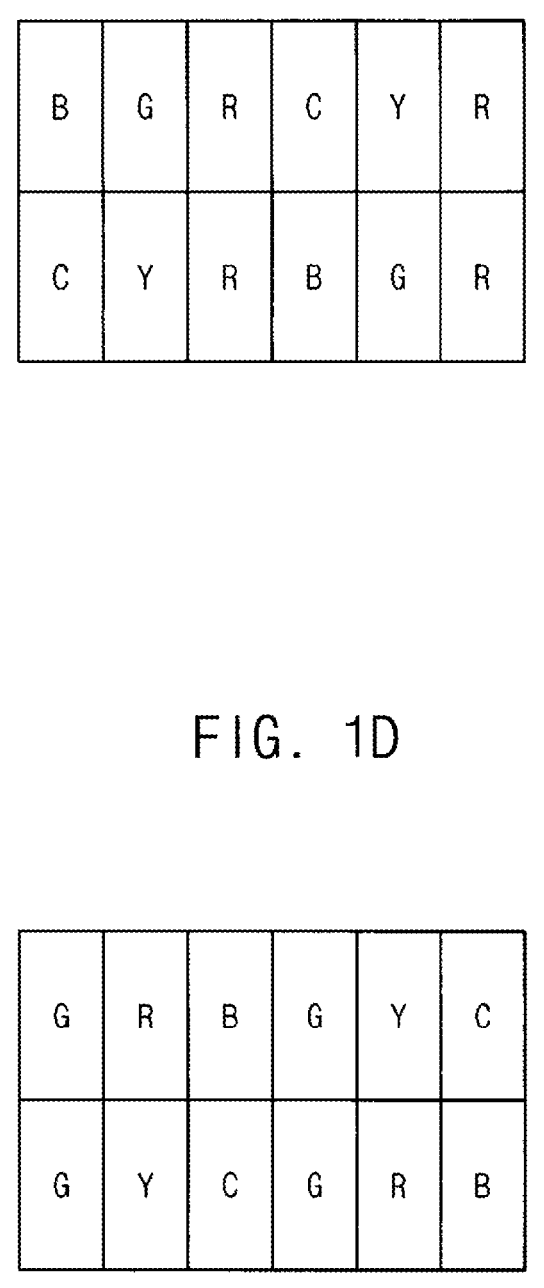

FIGS. 1A to 1O are conceptual diagrams illustrating corresponding color arrangements of respective pixels groups (PRU's) according to a first class of embodiments of the present disclosure.

Referring to FIG. 1A, a corresponding pixels group PRU consists of a first pixel P1, a second pixel P2, a third pixel P3 and a fourth pixel P4.

The first pixel P1, the second pixel P2, the third pixel P3 and the fourth pixel P4 are arranged as a 2 pixels-by-2 pixels matrix (a 2*2 matrix). More specifically, the first pixel P1 is disposed in a first column of a first row of the 2*2 matrix. The second pixel P2 is disposed in a second column of the first row of the 2*2 matrix. The third pixel P3 is disposed a first column of a second row of the 2*2 matrix. The fourth pixel P4 is disposed in the second column of the second row of the 2*2 matrix.

The first pixel P1 consists of a first sub-pixel SP 11, a second sub-pixel SP 12 and a third sub-pixel SP13. The first sub-pixel SP 11, the second sub-pixel SP 12 and the third sub-pixel SP13 are sequentially disposed in a row direction, for example, from left to right in the recited order.

The second pixel P2 similarly and respectively consists of a respective first sub-pixel SP21, a respective second sub-pixel SP22 and a respective third sub-pixel SP23. The first sub-pixel SP21, the second sub-pixel SP22 and the third sub-pixel SP23 are sequentially disposed in a row direction, for example, from left to right in the recited order.

The third pixel P3 similarly and respectively consists of a respective first sub-pixel SP31, a respective second sub-pixel SP32 and a respective third sub-pixel SP33. The first sub-pixel SP31, the second sub-pixel SP32 and the third sub-pixel SP33 are sequentially disposed in a row direction, for example, from left to right in the recited order.

The fourth pixel P4 similarly and respectively consists of a respective first sub-pixel SP41, a respective second sub-pixel SP42 and a respective third sub-pixel SP43. The first sub-pixel SP41, the second sub-pixel SP42 and the third sub-pixel SP43 are sequentially disposed in a row direction, for example, from left to right in the recited order.

Thus, the respective first to third sub-pixels of the first and second pixels, namely, subpixels SP11, SP12, SP13, SP21, SP22 and SP23 are disposed in a same row. The respective first to third sub-pixels of the third and fourth pixels, namely, subpixels SP31, SP32, SP33, SP41, SP42 and SP43 are disposed in a same row. In addition, the respective first sub-pixels of the first and third pixels SP11 and SP31 are disposed in a same column. The respective second sub-pixels of the first and third pixels SP12 and SP32 are similarly disposed in a respective same column. The respective third sub-pixels of the first and third pixels SP13 and SP33 are disposed in a same column. Also, the respective first sub-pixels of the second and fourth pixels SP21 and SP41 are disposed in a same column. The respective second sub-pixels of the second and fourth pixels SP22 and SP42 are disposed in a same column. And similarly, the respective third sub-pixels of the second and fourth pixels, namely, SP23 and SP43 are disposed in a same column.

The first to third sub-pixels of the first to fourth sub-pixels SP11, SP12, SP13, SP21, SP22, SP23, SP31, SP32, SP33, SP41, SP42 and SP43 may have respective ones of multi primary colors. The multi primary colors may include red R, green G, blue B, cyan C, yellow Y, and magenta M.

In the example embodiment of FIG. 1A, the first sub-pixel of the first pixel SP11, the first sub-pixel of the second pixel SP 21, the first sub-pixel of the third pixel SP31 and the first sub-pixel of the fourth pixel SP41 have a same color, namely, the red R color.

The sub-pixels SP11 and SP31 or SP21 and SP41, having the red color R are disposed in same column. As mentioned above, it has been observed that vertical striping of the R, G, B primaries does not generally lead to perception of criss-crossing so that criss-crossing stripes of the red R color will typically not be visible to the human visual system due to presence of vertical red R stripes. Thus, display quality of the display apparatus may be improved.

The second sub-pixel of the first pixel SP12 and the second sub-pixel of the fourth pixel SP42 have a same color, the green color G. The third sub-pixel of the first pixel SP13 and the third sub-pixel of the fourth pixel SP43 have a same color, the blue color B. The second sub-pixel of the second pixel SP22 and the second sub-pixel of the third pixel SP32 have a same color, the cyan color C. The third sub-pixel of the second pixel SP23 and the third sub-pixel of the third pixel SP33 have a same color, the magenta color M.

As described above, one pixels group PRU includes an even number of sub-pixels for each respectively produced same color (e.g., 4R, 2G, 2B, 2C, 2M). Although a plurality of the pixels groups PRU are continuously disposed across the display area (DA) of the display device, the sub-pixels having same colors (except for red R) are disposed in different rows and are spaced apart from one another by 2 columns in each pixels group (PG), so that the sub-pixels having same color (except for red R) are not adjacently disposed in same columns to create appearance of vertical stripes of the same. In other words, the various colors (except for red R) are spaced apart in farthest position from one another in each respective PRU. Thus, criss-cross stripes are less visible for these other colors (those other that red R) than in display devices whose PRU's have same colored sub-pixels that are more closely disposed within the PRU to one another, so that a displaying quality of the less coalesced colors (e.g., 2G, 2B, 2C, 2M in FIG. 1A but not R) may be improved.

Referring to FIG. 1B, the arrangement scheme for subpixels of this pixels group is roughly the same as that of the pixels group of FIG. 1A, except for the identity and the detailed arrangement of the specific colors. Thus, further detailed repetition concerning the placement of the basic elements will be omitted. In FIG. 1B the collection may be summarized as: 4R, 2G, 2B, 2C, 2Y (no M).

More specifically, the pixels group (PG) of FIG. 1B includes a first pixel (P1; refer to FIG. 1A for placement), a second pixel (P2), a third pixel (P3) and a fourth pixel (P4). The first pixel P1, the second pixel P2, the third pixel P3 and the fourth pixel P4 of FIG. 1B are arranged in a 2*2 matrix.

In a present example embodiment of FIG. 1B, the second sub-pixel of the first pixel SP12, the second sub-pixel of the second pixel SP 22, the second sub-pixel of the third pixel SP32 and the second sub-pixel of the fourth pixel SP42 have a same color, the red color R.

The sub-pixels SP12 and SP32 or SP22 and SP42, having the red R are disposed in same column, so that crossing stripes of the red R may not be visible to the human visual system. Thus, display quality of the display apparatus may be improved.

The third sub-pixel of the first pixel SP13 and the third sub-pixel of the fourth pixel SP43 have a same color, the green color G. The first sub-pixel of the first pixel SP11 and the first sub-pixel of the fourth pixel SP41 have a same color, the blue color B. The first sub-pixel of the second pixel SP21 and the first sub-pixel of the third pixel SP31 have a same color, the cyan color C. The third sub-pixel of the second pixel SP23 and the third sub-pixel of the third pixel SP33 have a same color, the yellow color Y (as opposed to the magenta color M that appears in FIG. 1A).

As described above, one pixels group PRU includes an even number of sub-pixels of each color (4R, 2G, 2B, 2C, 2Y). Although a plurality of the pixels groups PRU are continuously disposed, the sub-pixels having same color (except for red R) are disposed in different rows and spaced apart from one another by 2 columns, so that the sub-pixels having same color (e.g., red R) are either adjacently disposed in same column, or so that the sub-pixels having same color (e.g., other than red R) are spaced apart in farthest positions from one another within the given PRU and also paced apart in farthest positions from one another when appearing in alike neighboring PRU's. Thus, cross stripes are less visible to the human visual system than in comparative other systems where the same color sub-pixels are nearly disposed to one another, so that displaying quality may be improved. Also in the case of FIG. 1B, closely adjacent white metamers (where a metamer is a combination of adjacent primaries) can be generated because C+R=W inside one PRU and Y+B=W as between adjacent PRU's in the row direction and R+G+B=W also inside one PRU.

Referring to FIG. 1C, the pixels group is substantially same as the pixels group of FIG. 1A, except for an arrangement of colors. Thus, any further detailed descriptions concerning the same elements will be omitted. In FIG. 1C the collection may be summarized as: 4R, 2G, 2B, 2C, 2Y (no M)—just as in FIG. 1B except the vertically aligned pairs of red (R) subpixels are in slightly different columns.

The pixels group (PG) of FIG. 1C includes a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 includes a first sub-pixel (SP11), a second sub-pixel (SP12) and a third sub-pixel (SP13) which are sequentially disposed. The second pixel P2 includes a first sub-pixel (SP21), a second sub-pixel (SP22) and a third sub-pixel (SP23) which are sequentially disposed. The third pixel P3 includes a first sub-pixel (SP31), a second sub-pixel (SP32) and a third sub-pixel (SP33) which are sequentially disposed. The fourth pixel P4 includes a first sub-pixel (SP41), a second sub-pixel (SP42) and a third sub-pixel (SP43) which are sequentially disposed.

In a present example embodiment, the third sub-pixel of the first pixel SP13, the third sub-pixel of the second pixel SP23, the third sub-pixel of the third pixel SP33 and the third sub-pixel of the fourth pixel SP43 have a same color, the red color R.

The sub-pixels SP13 and SP33 or SP23 and SP43, having the red R are disposed in same columns, so that crossing stripes of the red R may not be visible. Thus, display quality of the display apparatus may be improved.

The second sub-pixel of the first pixel SP12 and the second sub-pixel of the fourth pixel SP42 have a same color, the green color G. The first sub-pixel of the first pixel SP11 and the first sub-pixel of the fourth pixel SP41 have a same color, the blue color B. The first sub-pixel of the second pixel SP21 and the first sub-pixel of the third pixel SP31 have a same color, the cyan color C. The second sub-pixel of the second pixel SP22 and the second sub-pixel of the third pixel SP32 have a same color, the yellow color Y.

As described above, the pixels group PRU of FIG. 1C similarly includes an even number of sub-pixels for each color. Although a plurality of the pixels groups PRU are continuously disposed, the sub-pixels (except for red R) having a same color are disposed in different rows and spaced apart by 2 columns, so that the sub-pixels having those same colors are spaced apart in farthest positions relative to one another. Thus, cross stripes are less visible comparing that the same color sub-pixels are nearly disposed, so that displaying quality may be improved.

Referring to FIG. 1D, the pixels group is substantially same as the pixels group of FIG. 1A, except for an arrangement of colors. Thus, any further detailed descriptions concerning the same elements will be omitted. In FIG. 1D the collection may be summarized as: 4G, 2R, 2B, 2C, 2Y (no M)—where the vertically aligned pairs of green (G) subpixels are in columns one and four.

The pixels group (PG) of FIG. 1D includes a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 includes a first sub-pixel (SP11), a second sub-pixel (SP12) and a third sub-pixel (SP13) which are sequentially disposed. The second pixel P2 includes a first sub-pixel (SP21), a second sub-pixel (SP22) and a third sub-pixel (SP23) which are sequentially disposed. The third pixel P3 includes a first sub-pixel (SP31), a second sub-pixel (SP32) and a third sub-pixel (SP33) which are sequentially disposed. The fourth pixel P4 includes a first sub-pixel (SP41), a second sub-pixel (SP42) and a third sub-pixel (SP43) which are sequentially disposed.

In a present example embodiment, the first sub-pixel of the first pixel SP11, the first sub-pixel of the second pixel SP 21, the first sub-pixel of the third pixel SP31 and the first sub-pixel of the fourth pixel SP41 have a same color, the green color G.

The sub-pixels SP11 and SP31 or SP21 and SP41, having the green G are disposed in same column, so that crossing stripes of the green G may not be visible. Thus, display quality of the display apparatus may be improved.

The second sub-pixel of the first pixel SP12 and the second sub-pixel of the fourth pixel SP42 have a same color, the red color R. The third sub-pixel of the first pixel SP13 and the third sub-pixel of the fourth pixel SP43 have a same color, the blue color B. The third sub-pixel of the second pixel SP23 and the third sub-pixel of the third pixel SP33 have a same color, the cyan color C. The second sub-pixel of the second pixel SP22 and the second sub-pixel of the third pixel SP32 have a same color, the yellow color Y.

As described above, the pixels group PRU of FIG. 1D includes even number of sub-pixels of each color. Although a plurality of the pixels groups PRU are continuously disposed, the sub-pixels having same color (except for green G) are disposed in different rows and spaced apart by 2 columns, so that the sub-pixels having same color (except for green G) are spaced apart in farthest positions relative to one another. Thus, cross stripes are less visible comparing that the same color sub-pixels are nearly disposed, so that displaying quality may be improved.

Figures 1E, 1F:
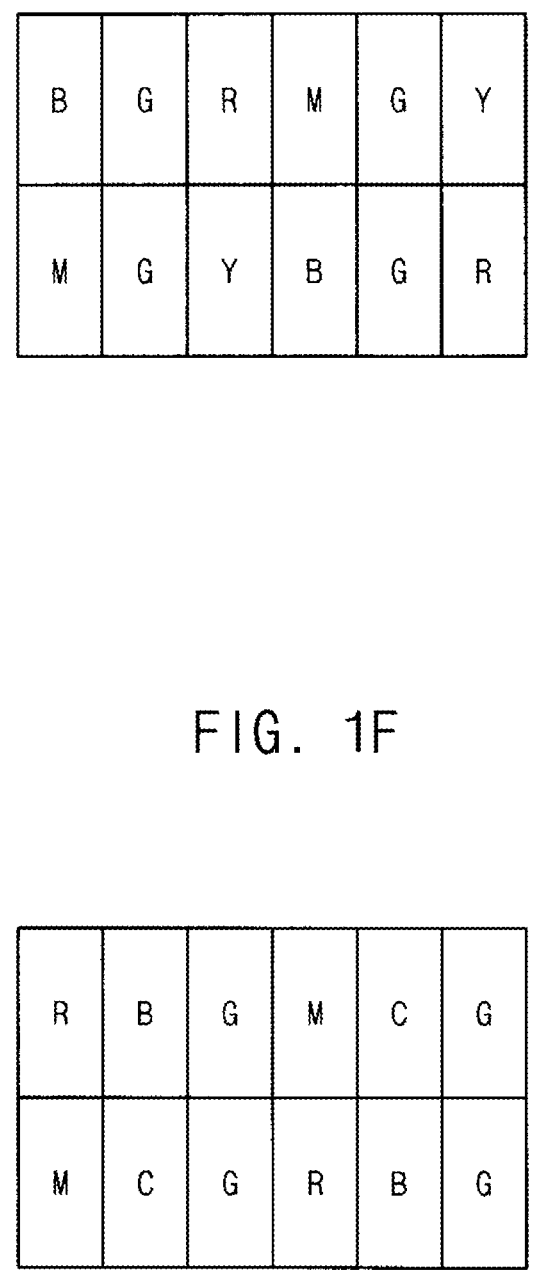

Referring to FIG. 1E, the pixels group is substantially same as the pixels group of FIG. 1A, except for an arrangement of colors. Thus, any further detailed descriptions concerning the same elements will be omitted. In FIG. 1E the collection may be summarized as: 4G, 2R, 2B, 2M, 2Y (no C)—where the vertically aligned pairs of green (G) subpixels are in slightly different columns than those of FIG. 1D.

The pixels group (PG) of FIG. 1E includes a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 includes a first sub-pixel (SP11), a second sub-pixel (SP12) and a third sub-pixel (SP13) which are sequentially disposed. The second pixel P2 includes a first sub-pixel (SP21), a second sub-pixel (SP22) and a third sub-pixel (SP23) which are sequentially disposed. The third pixel P3 includes a first sub-pixel (SP31), a second sub-pixel (SP32) and a third sub-pixel (SP33) which are sequentially disposed. The fourth pixel P4 includes a first sub-pixel (SP41), a second sub-pixel (SP42) and a third sub-pixel (SP43) which are sequentially disposed.

In a present example embodiment, the second sub-pixel of the first pixel SP12, the second sub-pixel of the second pixel SP 22, the second sub-pixel of the third pixel SP32 and the second sub-pixel of the fourth pixel SP42 have a same color, the green color G.

The sub-pixels SP12 and SP32 or SP22 and SP42, having the green color G are disposed in same column, so that crossing stripes of the green G may not be visible. Thus, display quality of the display apparatus may be improved.

The third sub-pixel of the first pixel SP13 and the third sub-pixel of the fourth pixel SP43 have a same color, the red color R. The first sub-pixel of the first pixel SP11 and the first sub-pixel of the fourth pixel SP41 have a same color, the blue color B. The first sub-pixel of the second pixel SP21 and the first sub-pixel of the third pixel SP31 have a same color, the magenta color M. The third sub-pixel of the second pixel SP23 and the third sub-pixel of the third pixel SP33 have a same color, the yellow color Y.

As described above, one pixels group PRU includes even number of sub-pixels of each color. Although a plurality of the pixels groups PRU are continuously disposed, the sub-pixels having a same color (except for green G) are disposed in different rows and spaced apart by 2 columns, so that the sub-pixels having those same color are spaced apart in farthest positions. Thus, cross stripes are less visible comparing that the same color sub-pixels are nearly disposed, so that displaying quality may be improved.

Referring to FIG. 1F, the pixels group is substantially same as the pixels group of FIG. 1A, except for an arrangement of colors. Thus, any further detailed descriptions concerning the same elements will be omitted. In FIG. 1F the collection may be summarized as: 4G, 2R, 2B, 2C, 2M (no Y)—where the vertically aligned pairs of green (G) subpixels are in slightly different columns than those of FIG. 1E.

The pixels group (PRU of FIG. 1A) includes a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 includes a first sub-pixel (SP11), a second sub-pixel (SP12) and a third sub-pixel (SP13) which are sequentially disposed. The second pixel P2 includes a first sub-pixel (SP21), a second sub-pixel (SP22) and a third sub-pixel (SP23) which are sequentially disposed. The third pixel P3 includes a first sub-pixel (SP31), a second sub-pixel (SP32) and a third sub-pixel (SP33) which are sequentially disposed. The fourth pixel P4 includes a first sub-pixel (SP41), a second sub-pixel (SP42) and a third sub-pixel (SP43) which are sequentially disposed.

In a present example embodiment, the third sub-pixel of the first pixel SP13, the third sub-pixel of the second pixel SP23, the third sub-pixel of the third pixel SP33 and the third sub-pixel of the fourth pixel SP43 have a same color, the green color G.

The sub-pixels SP13 and SP33 or SP23 and SP43, having the green G are disposed in same column, so that crossing stripes of the green G may not be visible. Thus, display quality of the display apparatus may be improved.

The first sub-pixel of the first pixel SP11 and the first sub-pixel of the fourth pixel SP41 have a same color, the red color R. The second sub-pixel of the first pixel SP12 and the second sub-pixel of the fourth pixel SP42 have a same color, the blue color B. The first sub-pixel of the second pixel SP21 and the first sub-pixel of the third pixel SP31 have a same color, the magenta color M. The second sub-pixel of the second pixel SP22 and the second sub-pixel of the third pixel SP32 have a same color, the cyan color C.

As described above, one pixels group PRU includes even number of sub-pixels of each color. Although a plurality of the pixels groups PRU are continuously disposed, the sub-pixels having same color (except for green G) are disposed in different rows and spaced apart by 2 columns, so that the sub-pixels having same color are spaced apart in farthest positions. Thus, cross stripes are less visible comparing that the same color sub-pixels are nearly disposed, so that displaying quality may be improved.

Figures 1G, 1H:
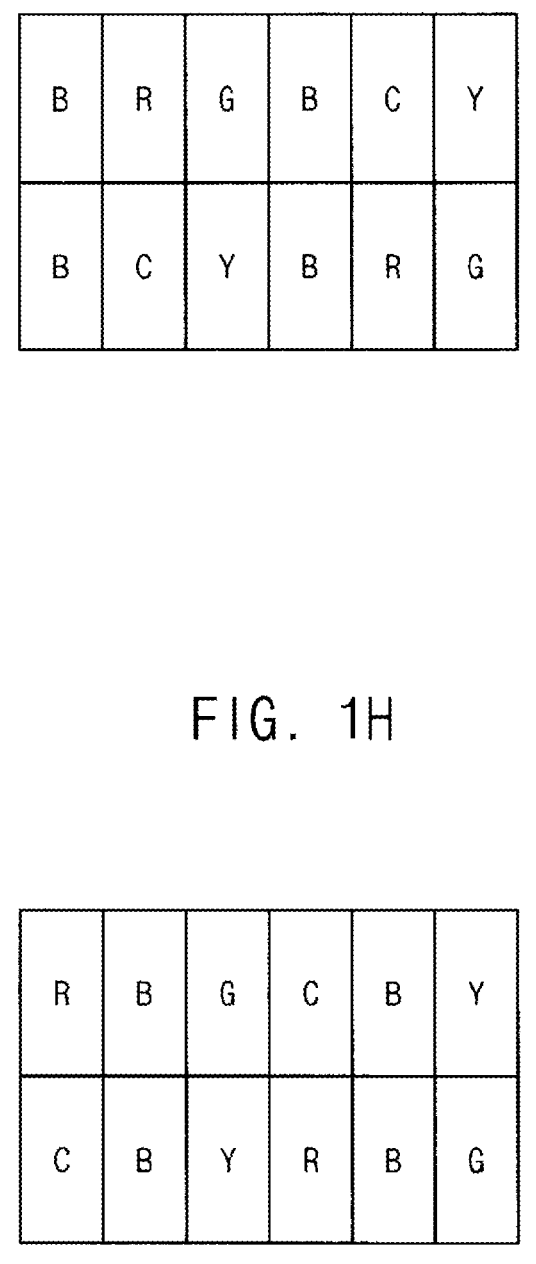

Referring to FIG. 1G, the pixels group is substantially same as the pixels group of FIG. 1A, except for an arrangement of colors. Thus, any further detailed descriptions concerning the same elements will be omitted. In FIG. 1G the collection may be summarized as: 4B . . . (no M).

The pixels group (PG) of FIG. 1G includes a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 includes a first sub-pixel (SP11), a second sub-pixel (SP12) and a third sub-pixel (SP13) which are sequentially disposed. The second pixel P2 includes a first sub-pixel (SP21), a second sub-pixel (SP22) and a third sub-pixel (SP23) which are sequentially disposed. The third pixel P3 includes a first sub-pixel (SP31), a second sub-pixel (SP32) and a third sub-pixel (SP33) which are sequentially disposed. The fourth pixel P4 includes a first sub-pixel (SP41), a second sub-pixel (SP42) and a third sub-pixel (SP43) which are sequentially disposed.

In a present example embodiment, the first sub-pixel of the first pixel SP11, the first sub-pixel of the second pixel SP 21, the first sub-pixel of the third pixel SP31 and the first sub-pixel of the fourth pixel SP41 have a same color, the blue color B.

The sub-pixels SP11 and SP31 or SP21 and SP41, having the blue B are disposed in same column, so that crossing stripes of the blue B may not be visible. Thus, display quality of the display apparatus may be improved.

The second sub-pixel of the first pixel SP12 and the second sub-pixel of the fourth pixel SP42 have a same color, the red color R. The third sub-pixel of the first pixel SP13 and the third sub-pixel of the fourth pixel SP43 have a same color, the green color G. The second sub-pixel of the second pixel SP22 and the second sub-pixel of the third pixel SP32 have a same color, the cyan C. The third sub-pixel of the second pixel SP23 and the third sub-pixel of the third pixel SP33 have a same color, the yellow color Y.

As described above, one pixels group PRU includes even number of sub-pixels of each color. Although a plurality of the pixels groups PRU are continuously disposed, the sub-pixels having same color (except for blue B) are disposed in different rows and spaced apart by 2 columns, so that the sub-pixels having same color (except for blue B) are spaced apart in farthest positions. Thus, cross stripes are less visible comparing that the same color sub-pixels are nearly disposed, so that displaying quality may be improved.

Referring to FIG. 1H, the pixels group is substantially same as the pixels group of FIG. 1A, except for an arrangement of colors. Thus, any further detailed descriptions concerning the same elements will be omitted. In FIG. 1H the collection may be summarized as: 4B . . . (no M) where the 4B are in different columns from that of FIG. 1G.

The pixels group (PG) of FIG. 1H includes a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 includes a first sub-pixel (SP11), a second sub-pixel (SP12) and a third sub-pixel (SP13) which are sequentially disposed. The second pixel P2 includes a first sub-pixel (SP21), a second sub-pixel (SP22) and a third sub-pixel (SP23) which are sequentially disposed. The third pixel P3 includes a first sub-pixel (SP31), a second sub-pixel (SP32) and a third sub-pixel (SP33) which are sequentially disposed. The fourth pixel P4 includes a first sub-pixel (SP41), a second sub-pixel (SP42) and a third sub-pixel (SP43) which are sequentially disposed.

In a present example embodiment, the second sub-pixel of the first pixel SP12, the second sub-pixel of the second pixel SP 22, the second sub-pixel of the third pixel SP32 and the second sub-pixel of the fourth pixel SP42 have a same color, the blue color B.

The sub-pixels SP12 and SP32 or SP22 and SP42, having the blue B are disposed in same column, so that crossing stripes of the blue B may not be visible. Thus, display quality of the display apparatus may be improved.

The first sub-pixel of the first pixel SP11 and the first sub-pixel of the fourth pixel SP41 have a same color, the red color R. The third sub-pixel of the first pixel SP13 and the third sub-pixel of the fourth pixel SP43 have a same color, the green color G. The first sub-pixel of the second pixel SP21 and the first sub-pixel of the third pixel SP31 have a same color, the cyan color C. The third sub-pixel of the second pixel SP23 and the third sub-pixel of the third pixel SP33 have a same color, the yellow color Y.

As described above, one pixels group PRU includes even number of sub-pixels of each color. Although a plurality of the pixels groups PRU are continuously disposed, the sub-pixels having same color (except for blue B) are disposed in different rows and spaced apart by 2 columns, so that the sub-pixels having same color (except for blue B) are spaced apart in farthest positions. Thus, cross stripes are less visible comparing that the same color sub-pixels are nearly disposed, so that displaying quality may be improved.

Figures 1I, 1J:
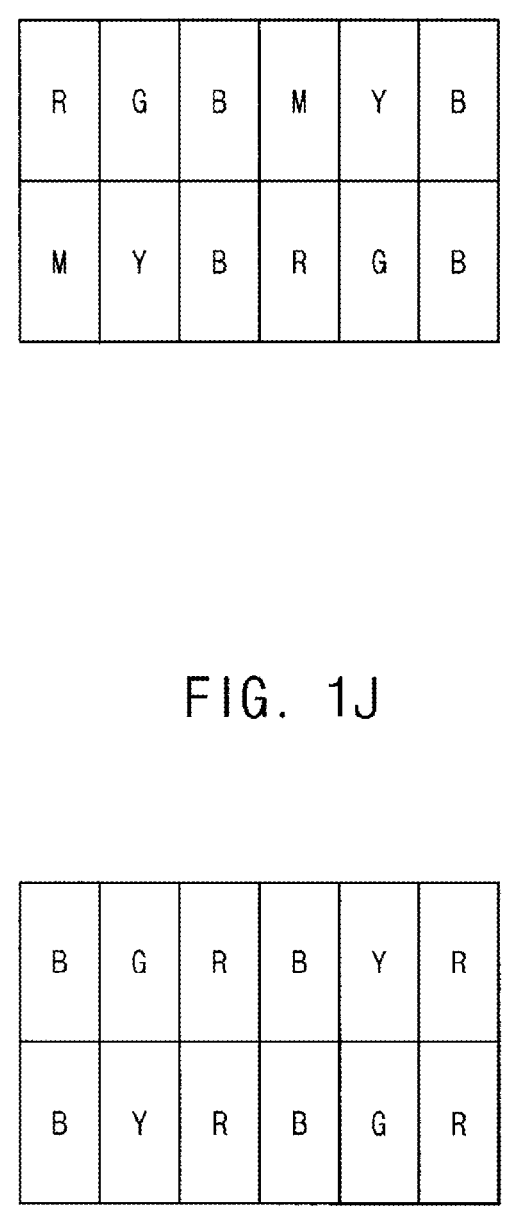

Referring to FIG. 1I, the pixels group is substantially same as the pixels group of FIG. 1A, except for an arrangement of colors. Thus, any further detailed descriptions concerning the same elements will be omitted. In FIG. 1I the collection may be summarized as: 4B . . . (no C) where the 4B are in different columns from that of FIG. 1H.

The pixels group (PG) of FIG. 1I includes a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 includes a first sub-pixel (SP11), a second sub-pixel (SP12) and a third sub-pixel (SP13) which are sequentially disposed. The second pixel P2 includes a first sub-pixel (SP21), a second sub-pixel (SP22) and a third sub-pixel (SP23) which are sequentially disposed. The third pixel P3 includes a first sub-pixel (SP31), a second sub-pixel (SP32) and a third sub-pixel (SP33) which are sequentially disposed. The fourth pixel P4 includes a first sub-pixel (SP41), a second sub-pixel (SP42) and a third sub-pixel (SP43) which are sequentially disposed.

In a present example embodiment, the third sub-pixel of the first pixel SP13, the third sub-pixel of the second pixel SP23, the third sub-pixel of the third pixel SP33 and the third sub-pixel of the fourth pixel SP43 have a same color, the blue color B.

The sub-pixels SP13 and SP33 or SP23 and SP43, having the blue B are disposed in same column, so that crossing stripes of the blue B may not be visible. Thus, display quality of the display apparatus may be improved.

The first sub-pixel of the first pixel SP11 and the first sub-pixel of the fourth pixel SP41 have a same color, the red color R. The second sub-pixel of the first pixel SP12 and the second sub-pixel of the fourth pixel SP42 have a same color, the green color G. The first sub-pixel of the second pixel SP21 and the first sub-pixel of the third pixel SP31 have a same color, the magenta color M. The second sub-pixel of the second pixel SP22 and the second sub-pixel of the third pixel SP32 have a same color, the yellow color Y.

As described above, one pixels group PRU includes even number of sub-pixels of each color. Although a plurality of the pixels groups PRU are continuously disposed, the sub-pixels having same color are disposed in different rows and spaced apart by 2 columns, so that the sub-pixels having same color are adjacently disposed in same column, or are spaced apart in farthest position. Thus, cross stripes are less visible comparing that the same color sub-pixels are nearly disposed, so that displaying quality may be improved.

Referring to FIG. 1J, the pixels group is substantially same as the pixels group of FIG. 1A, except for an arrangement of colors. Thus, any further detailed descriptions concerning the same elements will be omitted. In FIG. 1J the collection may be summarized as: 4R, 4B, 2G, 2Y (no C, no M)—where the vertically aligned pairs of red (R) subpixels and blue (B) are come to be adjacent one to the other as RB pairs when viewed in the context of neighboring and alike PRU's.

The pixels group (PG) of FIG. 1J includes a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 includes a first sub-pixel (SP11), a second sub-pixel (SP12) and a third sub-pixel (SP13) which are sequentially disposed. The second pixel P2 includes a first sub-pixel (SP21), a second sub-pixel (SP22) and a third sub-pixel (SP23) which are sequentially disposed. The third pixel P3 includes a first sub-pixel (SP31), a second sub-pixel (SP32) and a third sub-pixel (SP33) which are sequentially disposed. The fourth pixel P4 includes a first sub-pixel (SP41), a second sub-pixel (SP42) and a third sub-pixel (SP43) which are sequentially disposed.

In a present example embodiment, the first sub-pixel of the first pixel SP11, the first sub-pixel of the second pixel SP 21, the first sub-pixel of the third pixel SP31 and the first sub-pixel of the fourth pixel SP41 have a same color, the blue color B.

The sub-pixels SP11 and SP31 or SP21 and SP41, having the blue B are disposed in same column, so that crossing stripes of the blue B may not be visible. Thus, display quality of the display apparatus may be improved.

The third sub-pixel of the first pixel SP13, the third sub-pixel of the second pixel SP23, the third sub-pixel of the third pixel SP33 and the third sub-pixel of the fourth pixel SP43 have a same color, the red color R.

The sub-pixels SP13 and SP33 or SP23 and SP43, having the red R are disposed in same column, so that crossing stripes of the red R may not be visible. Thus, display quality of the display apparatus may be improved.

The second sub-pixel of the first pixel SP12 and the second sub-pixel of the fourth pixel SP42 have a same color, the green color G. The second sub-pixel of the second pixel SP22 and the second sub-pixel of the third pixel SP32 have a same color, the yellow color Y.

As described above, one pixels group PRU includes even number of sub-pixels of each color. Although a plurality of the pixels groups PRU are continuously disposed, the sub-pixels having same color (except for red R and except for blue B) are disposed in different rows and spaced apart by 2 columns, so that the sub-pixels having same color are adjacently disposed in same column, or are spaced apart in farthest positions. Thus, cross stripes are less visible comparing that the same color sub-pixels are nearly disposed, so that displaying quality may be improved.

Figures 1K, 1L:
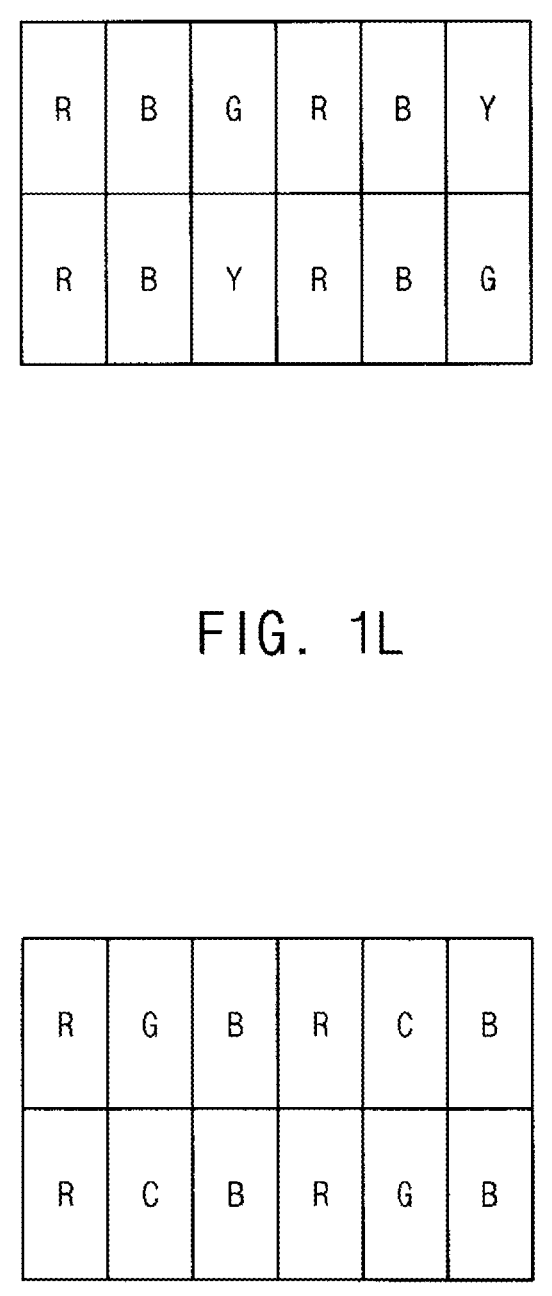

Referring to FIG. 1K, the pixels group is substantially same as the pixels group of FIG. 1A, except for an arrangement of colors. Thus, any further detailed descriptions concerning the same elements will be omitted. In FIG. 1K the collection may be summarized as: 4R, 4B, 2G, 2Y (no C, no M)—where the vertically aligned pairs of red (R) subpixels and blue (B) are come to be adjacent one to the other as RB pairs in the one PRU.

The pixels group (PG) of FIG. 1K includes a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 includes a first sub-pixel (SP11), a second sub-pixel (SP12) and a third sub-pixel (SP13) which are sequentially disposed. The second pixel P2 includes a first sub-pixel (SP21), a second sub-pixel (SP22) and a third sub-pixel (SP23) which are sequentially disposed. The third pixel P3 includes a first sub-pixel (SP31), a second sub-pixel (SP32) and a third sub-pixel (SP33) which are sequentially disposed. The fourth pixel P4 includes a first sub-pixel (SP41), a second sub-pixel (SP42) and a third sub-pixel (SP43) which are sequentially disposed.

In a present example embodiment, the first sub-pixel of the first pixel SP11, the first sub-pixel of the second pixel SP 21, the first sub-pixel of the third pixel SP31 and the first sub-pixel of the fourth pixel SP41 have a same color, the red color R.

The sub-pixels SP11 and SP31 or SP21 and SP41, having the red R are disposed in same column, so that crossing stripes of the red R may not be visible. Thus, display quality of the display apparatus may be improved.

The second sub-pixel of the first pixel SP12, the second sub-pixel of the second pixel SP22, the second sub-pixel of the third pixel SP32 and the second sub-pixel of the fourth pixel SP42 have a same color, the blue color B.

The sub-pixels SP12 and SP32 or SP22 and SP42, having the blue B are disposed in same column, so that crossing stripes of the blue B may not be visible. Thus, display quality of the display apparatus may be improved.

The third sub-pixel of the first pixel SP13 and the third sub-pixel of the fourth pixel SP43 have a same color, the green color G. The third sub-pixel of the second pixel SP23 and the third sub-pixel of the third pixel SP33 have a same color, the yellow color Y.

As described above, one pixels group PRU includes even number of sub-pixels having same color. Although a plurality of the pixels groups PRU are continuously disposed, the sub-pixels having same color (except for red R and except for blue B) are disposed in different rows and spaced apart by 2 columns, so that the sub-pixels having same color are either adjacently disposed in same column (true for red R and for blue B), or are spaced apart in farthest positions (true for the other colors). Thus, cross stripes are less visible comparing that the same color sub-pixels are nearly disposed, so that displaying quality may be improved.

Referring to FIG. 1L, the pixels group is substantially same as the pixels group of FIG. 1A, except for an arrangement of colors. Thus, any further detailed descriptions concerning the same elements will be omitted. In FIG. 1L the collection may be summarized as: 4R, 4B, 2G, 2C (no Y, no M)—where the vertically aligned pairs of red (R) subpixels and blue (B) are come to be adjacent one to the other as BR pairs when viewed in the context of neighboring and alike PRU's.

The pixels group (PG) of FIG. 1L consists of a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 includes a first sub-pixel (SP11), a second sub-pixel (SP12) and a third sub-pixel (SP13) which are sequentially disposed. The second pixel P2 includes a first sub-pixel (SP21), a second sub-pixel (SP22) and a third sub-pixel (SP23) which are sequentially disposed. The third pixel P3 includes a first sub-pixel (SP31), a second sub-pixel (SP32) and a third sub-pixel (SP33) which are sequentially disposed. The fourth pixel P4 includes a first sub-pixel (SP41), a second sub-pixel (SP42) and a third sub-pixel (SP43) which are sequentially disposed.

In a present example embodiment, the first sub-pixel of the first pixel SP11, the first sub-pixel of the second pixel SP 21, the first sub-pixel of the third pixel SP31 and the first sub-pixel of the fourth pixel SP41 have a same color, the red color R.

The sub-pixels SP11 and SP31 or SP21 and SP41, having the red color R are disposed in same column, so that crossing stripes of the red R may not be visible. Thus, display quality of the display apparatus may be improved.

The third sub-pixel of the first pixel SP13, the third sub-pixel of the second pixel SP23, the third sub-pixel of the third pixel SP33 and the third sub-pixel of the fourth pixel SP43 have a same color, the blue color B.

The sub-pixels SP13 and SP33 or SP23 and SP43, having the blue color B are disposed in same column, so that crossing stripes of the blue B may not be visible. Thus, display quality of the display apparatus may be improved.

The second sub-pixel of the first pixel SP12 and the second sub-pixel of the fourth pixel SP42 have a same color, the green color G. The second sub-pixel of the second pixel SP22 and the second sub-pixel of the third pixel SP32 have a same color, the cyan color C.

As described above, the pixels group PRU of FIG. 1L includes even numbers of sub-pixels of each color. Although a plurality of the pixels groups PRU are continuously disposed, the sub-pixels having same color (except for red R and except for blue B) are disposed in different rows and spaced apart by 2 columns, so that the sub-pixels having same color are either adjacently disposed in same column (true for red R and for blue B), or are spaced apart in farthest positions. Thus, cross stripes are less visible comparing that the same color sub-pixels are nearly disposed, so that displaying quality may be improved.

Figures 1M, 1N:
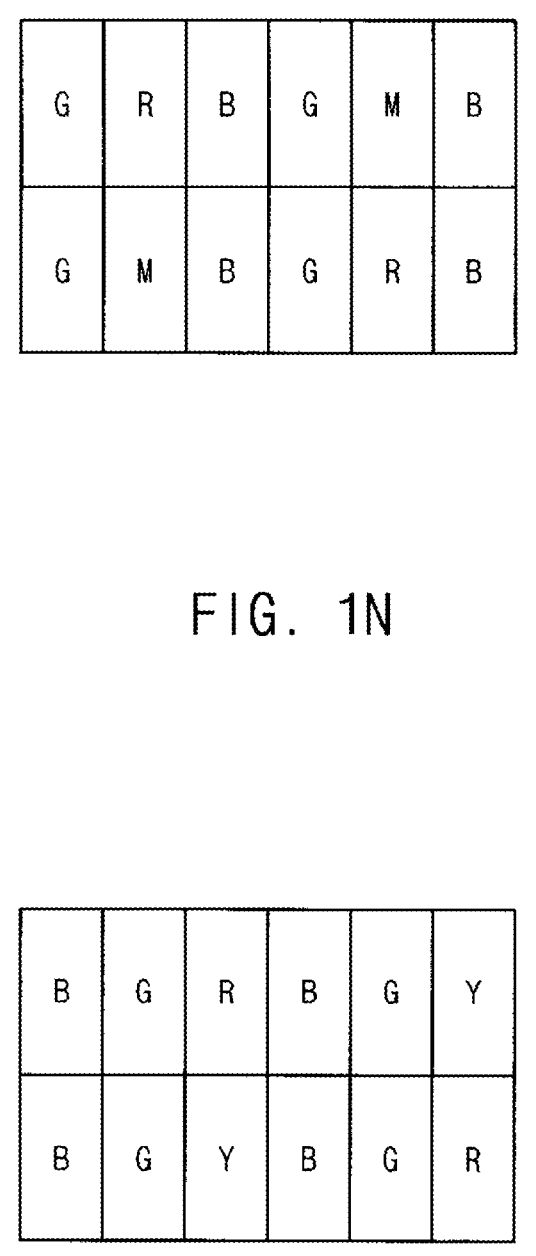

Referring to FIG. 1M, the pixels group is substantially same as the pixels group of FIG. 1A, except for an arrangement of colors. Thus, any further detailed descriptions concerning the same elements will be omitted. In FIG. 1M the collection may be summarized as: 4G, 4B, 2R, 2M (no Y, no C)—where the vertically aligned pairs of green (G) subpixels and blue (B) are come to be adjacent one to the other as BG pairs when viewed in the context of neighboring and alike PRU's.

The pixels group (PG) of FIG. 1M includes a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 includes a first sub-pixel (SP11), a second sub-pixel (SP12) and a third sub-pixel (SP13) which are sequentially disposed. The second pixel P2 includes a first sub-pixel (SP21), a second sub-pixel (SP22) and a third sub-pixel (SP23) which are sequentially disposed. The third pixel P3 includes a first sub-pixel (SP31), a second sub-pixel (SP32) and a third sub-pixel (SP33) which are sequentially disposed. The fourth pixel P4 includes a first sub-pixel (SP41), a second sub-pixel (SP42) and a third sub-pixel (SP43) which are sequentially disposed.

In a present example embodiment, the first sub-pixel of the first pixel SP11, the first sub-pixel of the second pixel SP 21, the first sub-pixel of the third pixel SP31 and the first sub-pixel of the fourth pixel SP41 have a same color, the green color G.

The sub-pixels SP11 and SP31 or SP21 and SP41, having the green color G are disposed in same column, so that crossing stripes of the green G may not be visible. Thus, display quality of the display apparatus may be improved.

The third sub-pixel of the first pixel SP13, the third sub-pixel of the second pixel SP23, the third sub-pixel of the third pixel SP33 and the third sub-pixel of the fourth pixel SP43 have a same color, the blue color B.

The sub-pixels SP13 and SP33 or SP23 and SP43, having the blue color B are disposed in same column, so that crossing stripes of the blue B may not be visible. Thus, display quality of the display apparatus may be improved.

The second sub-pixel of the first pixel SP12 and the second sub-pixel of the fourth pixel SP42 have a same color, the red color R. The second sub-pixel of the second pixel SP22 and the second sub-pixel of the third pixel SP32 have a same color, the magenta color M.

As described above, the pixels group PRU of FIG. 1M includes even number of sub-pixels of each color. Although a plurality of the pixels groups PRU are continuously disposed, the sub-pixels having same color (except for green G and except for blue B) are disposed in different rows and spaced apart by 2 columns, so that the sub-pixels having same color are adjacently disposed in a same column (true for green G and for blue B), or are spaced apart in farthest positions. Thus, cross stripes are less visible comparing that the same color sub-pixels are nearly disposed, so that displaying quality may be improved.

Referring to FIG. 1N, the pixels group is substantially same as the pixels group of FIG. 1A, except for an arrangement of colors. Thus, any further detailed descriptions concerning the same elements will be omitted. In FIG. 1N the collection may be summarized as: 4G, 4B, 2R, 2Y (no C, no M)—where the vertically aligned pairs of green (G) subpixels and blue (B) are come to be adjacent one to the other as BG pairs in the one PRU.

The pixels group (PG) of FIG. 1N includes a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 includes a first sub-pixel (SP11), a second sub-pixel (SP12) and a third sub-pixel (SP13) which are sequentially disposed. The second pixel P2 includes a first sub-pixel (SP21), a second sub-pixel (SP22) and a third sub-pixel (SP23) which are sequentially disposed. The third pixel P3 includes a first sub-pixel (SP31), a second sub-pixel (SP32) and a third sub-pixel (SP33) which are sequentially disposed. The fourth pixel P4 includes a first sub-pixel (SP41), a second sub-pixel (SP42) and a third sub-pixel (SP43) which are sequentially disposed.

In a present example embodiment, the first sub-pixel of the first pixel SP11, the first sub-pixel of the second pixel SP 21, the first sub-pixel of the third pixel SP31 and the first sub-pixel of the fourth pixel SP41 have a same color, the blue color B.

The sub-pixels SP11 and SP31 or SP21 and SP41, having the blue color B are disposed in same column, so that crossing stripes of the blue B may not be visible. Thus, display quality of the display apparatus may be improved.

The second sub-pixel of the first pixel SP12, the second sub-pixel of the second pixel SP 22, the second sub-pixel of the third pixel SP32 and the second sub-pixel of the fourth pixel SP42 have a same color, the green color G.

The sub-pixels SP12 and SP32 or SP22 and SP42, having the green color G are disposed in same column, so that crossing stripes of the green G may not be visible. Thus, display quality of the display apparatus may be improved.

The third sub-pixel of the first pixel SP 13 and the third sub-pixel of the fourth pixel SP43 have a same color, the red color R. The third sub-pixel of the second pixel SP23 and the third sub-pixel of the third pixel SP33 have a same color, the yellow color Y.

As described above, one pixels group PRU includes even numbers of sub-pixels of each color. Although a plurality of the pixels groups PRU are continuously disposed, the sub-pixels having same color (except for green G and except for blue B) are disposed in different rows and spaced apart by 2 columns, so that the sub-pixels having same color are either adjacently disposed in same column (true for green G and for blue B), or are spaced apart in farthest positions. Thus, cross stripes are less visible comparing that the same color sub-pixels are nearly disposed, so that displaying quality may be improved.

Referring to FIG. 1O, the pixels group is substantially same as the pixels group of FIG. 1A, except for an arrangement of colors. Thus, any further detailed descriptions concerning the same elements will be omitted. In FIG. 1O the collection may be summarized as: 4G, 4B, 2R, 2Y (no C, no M)—where the vertically aligned pairs of green (G) subpixels and blue (B) are come to be adjacent one to the other as GB pairs in the one PRU.

The pixels group (PG) of FIG. 1O includes a first pixel (P1), a second pixel (P2), a third pixel (P3) and a fourth pixel (P4). The first pixel P1, the second pixel P2, the third pixel P3 and the fourth pixel P4 are arranged in a 2*2 matrix (of pixels each consisting of 3 subpixels).

The first pixel P1 consists of a first sub-pixel (SP11), a second sub-pixel (SP12) and a third sub-pixel (SP13) which are sequentially disposed. The second pixel P2 consists of a first sub-pixel (SP21), a second sub-pixel (SP22) and a third sub-pixel (SP23) which are sequentially disposed. The third pixel P3 consists of a first sub-pixel (SP31), a second sub-pixel (SP32) and a third sub-pixel (SP33) which are sequentially disposed. The fourth pixel P4 consists of a first sub-pixel (SP41), a second sub-pixel (SP42) and a third sub-pixel (SP43) which are sequentially disposed.

In a present example embodiment, the second sub-pixel of the first pixel SP12, the second sub-pixel of the second pixel SP 22, the second sub-pixel of the third pixel SP32 and the second sub-pixel of the fourth pixel SP42 have a same color, the green color G.

The sub-pixels SP12 and SP32 or SP22 and SP42, having the green color G are disposed in same column, so that crossing stripes of the green G may not be visible. Thus, display quality of the display apparatus may be improved.

The third sub-pixel of the first pixel SP13, the third sub-pixel of the second pixel SP 23, the third sub-pixel of the third pixel SP33 and the third sub-pixel of the fourth pixel SP43 have a same color, the blue color B.

The sub-pixels SP13 and SP33 or SP23 and SP43, having the blue color B are disposed in same column, so that crossing stripes of the blue B may not be visible. Thus, display quality of the display apparatus may be improved.

The first sub-pixel of the first pixel SP11 and the first sub-pixel of the fourth pixel SP41 have a same color, the red R. The first sub-pixel of the second pixel SP21 and the first sub-pixel of the third pixel SP31 have a same color, the yellow color Y.

As described above, the pixels group PRU of FIG. 1O includes even numbers of sub-pixels of each same color. Although a plurality of the pixels groups PRU are continuously disposed, the sub-pixels having a same color (except for green G and except for blue B) are disposed in different rows and spaced apart by 2 columns, so that the sub-pixels having a same color are either adjacently disposed in same columns (true for green G and for blue B), or are spaced apart in farthest positions. Thus, cross stripes are less visible comparing that the same color sub-pixels are nearly disposed, so that displaying quality may be improved.

FIGS. 2A to 2E are conceptual diagrams illustrating color arrangement of a pixels group according to another class of example embodiments in accordance with the present disclosure. More specifically, here the pixels each consist of 4 subpixels.

Referring to FIG. 2A, the illustrated pixels group PRU consists of a first pixel P1, a second pixel P2, a third pixel P3 and a fourth pixel P4.

The first pixel P1, the second pixel P2, the third pixel P3 and the fourth pixel P4 are arranged in a 2*2 matrix (of 4×1 subpixels). Thus, the first pixel P1 is disposed in the first through fourth columns of the first row of the 2*2 matrix. The second pixel P2 is disposed in the fifth through eighth columns of the first row of the 2*2 matrix. The third pixel P3 is disposed in the first through fourth columns of the second row of the 2*2 matrix. The fourth pixel P4 is disposed in the fifth through eighth columns of the second row of the 2*2 matrix.

The first pixel P1 consists of a first sub-pixel SP11, a second sub-pixel SP12, a third sub-pixel SP13 and a fourth pixel SP14. The first sub-pixel SP11, the second sub-pixel SP12, the third sub-pixel SP13 and the fourth pixel SP14 are sequentially disposed in a row.

The second pixel P2 consists of a first sub-pixel SP21, a second sub-pixel SP22, a third sub-pixel SP23 and a fourth pixel SP24. The first sub-pixel SP21, the second sub-pixel SP22, the third sub-pixel SP23 and the fourth pixel SP24 are sequentially disposed in a row.

The third pixel P3 consists of a first sub-pixel SP31, a second sub-pixel SP32, a third sub-pixel SP33 and a fourth pixel SP34. The first sub-pixel SP31, the second sub-pixel SP32, the third sub-pixel SP33 and the fourth pixel SP34 are sequentially disposed in a row.

The fourth pixel P4 consists of a first sub-pixel SP41, a second sub-pixel SP42, a third sub-pixel SP43 and a fourth pixel SP44. The first sub-pixel SP41, the second sub-pixel SP42, the third sub-pixel SP43 and the fourth pixel SP44 are sequentially disposed in a row.

The first to third sub-pixels of the first to fourth sub-pixels SP11, SP12, SP13, SP14, SP21, SP22, SP23, SP24, SP31, SP32, SP33, SP34, SP41, SP42, SP43 and SP44 may have one of multi primary colors. The multi primary colors of each 4-colored PRU may include 4 colors selected from the group of the red color R, the green color G, the blue color B, the cyan color C, the yellow color Y, and the magenta color M.

In the present example embodiment of FIG. 2A, the first sub-pixel of the first pixel SP11, the first sub-pixel of the second pixel SP 21, the first sub-pixel of the third pixel SP31 and the first sub-pixel of the fourth pixel SP41 have a same color, the red color R. More succinctly, in FIG. 2A the collection may be summarized as: 4B, 4Y, 4R, 2G, 2C (no M)—where the vertically aligned pairs of blue (B), yellow (Y) and red (R) subpixels come to be adjacent one to the other as BYR triplets when viewed in the context of neighboring and alike PRU's.

In terms of more detail, the sub-pixels SP11 and SP31 or SP21 and SP41, having the red color R are disposed in same columns, so that crossing stripes of the red R may not be visible. Thus, display quality of the display apparatus may be improved.

The third sub-pixel of the first pixel SP13, the third sub-pixel of the second pixel SP 23, the third sub-pixel of the third pixel SP33 and the third sub-pixel of the fourth pixel SP43 have a same color, the blue color B.

The sub-pixels SP13 and SP33 or SP23 and SP43, having the blue color B are disposed in same column, so that crossing stripes of the blue B may not be visible. Thus, display quality of the display apparatus may be improved.

The fourth sub-pixel of the first pixel SP14, the fourth sub-pixel of the second pixel SP 24, the fourth sub-pixel of the third pixel SP34 and the fourth sub-pixel of the fourth pixel SP44 have a same color, the yellow color Y.

The sub-pixels SP14 and SP34 or SP24 and SP44, having the yellow color Y are disposed in same column, so that crossing stripes of the yellow color Y may not be visible. Thus, display quality of the display apparatus may be improved.

The second sub-pixel of the first pixel SP12 and the second sub-pixel of the fourth pixel SP42 have a same color, the green color G. The second sub-pixel of the second pixel SP22 and the second sub-pixel of the third pixel SP32 have a same color, the cyan color C.

As described above, the pixels group PRU of FIG. 2A includes even numbers of sub-pixels of each color. Although a plurality of the pixels groups PRU are continuously disposed, the sub-pixels having same color are disposed in different rows and spaced apart by 2 columns (true for G and C), so that the sub-pixels having same color are either adjacently disposed in same column (true for RYB), or are spaced apart in farthest positions (true for G and C). Thus, cross stripes are less visible comparing that the same color sub-pixels are nearly disposed, so that displaying quality may be improved.

Referring to FIG. 2B, the pixels group of this embodiment is substantially the same as the pixels group of FIG. 2A, except for an arrangement of colors. Thus, any further detailed descriptions concerning the same elements will be omitted. More succinctly, in FIG. 2B the collection may be summarized as: 4*(G+C+B), 2*(R+Y), (no M)—where the vertically aligned pairs of green (G), cyan (C) and blue (B) subpixels come to be adjacent one to the other as GCB triplets when viewed in the context of neighboring and alike PRU's.

The pixels group (PG) of FIG. 2B consists of a first pixel (P1 positioned same as in FIG. 2A), a second pixel (P2 positioned same as in FIG. 2A), a third pixel (P3 positioned same as in FIG. 2A) and a fourth pixel (P4 positioned same as in FIG. 2A). The first pixel P1, the second pixel P2, the third pixel P3 and the fourth pixel P4 are arranged in a 2*2 matrix.

The first pixel P1 consists of a first sub-pixel (SP11 positioned same as in FIG. 2A), a second sub-pixel (SP12 positioned same as in FIG. 2A), a third sub-pixel (SP13 positioned same as in FIG. 2A) and a fourth sub-pixel (SP14 positioned same as in FIG. 2A) which are sequentially disposed in a row. The second pixel P2 similarly consists of a first sub-pixel (SP21), a second sub-pixel (SP22), a third sub-pixel (SP23) and a fourth sub-pixel (SP24 FIG. 2A) which are sequentially disposed. The third pixel P3 includes a first sub-pixel (SP31), a second sub-pixel (SP32), a third sub-pixel (SP33) and a fourth sub-pixel (SP34) which are sequentially disposed. The fourth pixel P4 includes a first sub-pixel (SP41), a second sub-pixel (SP42), a third sub-pixel (SP43) and a fourth sub-pixel (SP44) which are sequentially disposed.

In a present example embodiment, the first sub-pixel of the first pixel SP11, the first sub-pixel of the second pixel SP 21, the first sub-pixel of the third pixel SP31 and the first sub-pixel of the fourth pixel SP41 have a same color, the blue color B.

The sub-pixels SP11 and SP31 or SP21 and SP41, having the blue color B are disposed in same column, so that crossing stripes of the blue B may not be visible. Thus, display quality of the display apparatus may be improved.

The third sub-pixel of the first pixel SP13, the third sub-pixel of the second pixel SP 23, the third sub-pixel of the third pixel SP33 and the third sub-pixel of the fourth pixel SP43 have a same color, the green color G.

The sub-pixels SP13 and SP33 or SP23 and SP43, having the green color G are disposed in same column, so that crossing stripes of the green G may not be visible. Thus, display quality of the display apparatus may be improved.

The fourth sub-pixel of the first pixel SP14, the fourth sub-pixel of the second pixel SP 24, the fourth sub-pixel of the third pixel SP34 and the fourth sub-pixel of the fourth pixel SP44 have a same color, the cyan color C.

The sub-pixels SP14 and SP34 or SP24 and SP44, having the cyan color C are disposed in same column, so that crossing stripes of the cyan C may not be visible. Thus, display quality of the display apparatus may be improved.

The second sub-pixel of the first pixel SP12 and the second sub-pixel of the fourth pixel SP42 have a same color, the red color R. The second sub-pixel of the second pixel SP22 and the second sub-pixel of the third pixel SP32 have a same color, the yellow color Y.

As described above, the pixels group PRU of FIG. 2B includes even numbers of sub-pixels of each color. Although a plurality of the pixels groups PRU are continuously disposed, the sub-pixels having same color are disposed in different rows and spaced apart by 2 columns (true for R+Y), so that the sub-pixels having same color are either adjacently disposed in same columns (true for G+C+B), or are spaced apart in farthest positions (true for R+Y). Thus, cross stripes are less visible comparing that the same color sub-pixels are nearly disposed, so that displaying quality may be improved.

Referring to FIG. 2C, the pixels group is basically the same as the pixels group of FIG. 2A, except for an arrangement of colors. Thus, any further detailed descriptions concerning the same elements will be omitted. More succinctly, in FIG. 2C the collection may be summarized as: 4*(R+Y), 2*(G+C+M+B)—where the vertically aligned pairs of red (R) and yellow (Y) subpixels come to be adjacent one to the other as YR pairs when viewed in the context of neighboring and alike PRU's.

The pixels group (PG) of FIG. 2C consists of a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 consists of a first sub-pixel (SP11), a second sub-pixel (SP12), a third sub-pixel (SP13) and a fourth sub-pixel (SP14) which are sequentially disposed. The second pixel P2 consists of a first sub-pixel (SP21), a second sub-pixel (SP22), a third sub-pixel (SP23) and a fourth sub-pixel (SP24) which are sequentially disposed. The third pixel P3 consists of a first sub-pixel (SP31), a second sub-pixel (SP32), a third sub-pixel (SP33) and a fourth sub-pixel (SP34) which are sequentially disposed. The fourth pixel P4 consists of a first sub-pixel (SP41), a second sub-pixel (SP42), a third sub-pixel (SP43) and a fourth sub-pixel (SP44) which are sequentially disposed.

In a present example embodiment of FIG. 2C, the first sub-pixel of the first pixel SP11, the first sub-pixel of the second pixel SP 21, the first sub-pixel of the third pixel SP31 and the first sub-pixel of the fourth pixel SP41 have a same color, the red color R.

The sub-pixels SP11 and SP31 or SP21 and SP41, having the red color R are disposed in same column, so that crossing stripes of the red R may not be visible. Thus, display quality of the display apparatus may be improved.

The fourth sub-pixel of the first pixel SP14, the fourth sub-pixel of the second pixel SP 24, the fourth sub-pixel of the third pixel SP34 and the fourth sub-pixel of the fourth pixel SP44 have a same color, the yellow color Y.

The sub-pixels SP14 and SP34 or SP24 and SP44, having the yellow color Y are disposed in same column, so that crossing stripes of the yellow Y may not be visible. Thus, display quality of the display apparatus may be improved.

The second sub-pixel of the first pixel SP12 and the second sub-pixel of the fourth pixel SP42 have a same color, the blue color B. The third sub-pixel of the first pixel SP13 and the third sub-pixel of the fourth pixel SP43 have a same color, the green color G. The second sub-pixel of the second pixel SP22 and the second sub-pixel of the third pixel SP32 have a same color, the cyan color C. The third sub-pixel of the second pixel SP23 and the third sub-pixel of the third pixel SP33 have a same color, the magenta color M As described above, the pixels group PRU of FIG. 2C includes even numbers of sub-pixels of each color. Although a plurality of the pixels groups PRU are continuously disposed, the sub-pixels having same color are disposed in different rows and spaced apart by 2 columns (true for G, C, M, B), so that the sub-pixels having same color are either adjacently disposed in same columns (true for R, Y), or are spaced apart in farthest positions (true for G, C, M, B). Thus, cross stripes are less visible comparing that the same color sub-pixels are nearly disposed, so that displaying quality may be improved.

Referring to FIG. 2D, the pixels group is substantially same as the pixels group of FIG. 2A, except for an arrangement of colors. Thus, any further detailed descriptions concerning the same elements will be omitted. More succinctly, in FIG. 2D the collection may be summarized as: 4*(B+R), 2*(G+Y+M+C)—where the vertically aligned pairs of blue (B) and red (R) subpixels come to be adjacent one to the other as BR stripe pairs when viewed in the context of neighboring and alike PRU's.

The pixels group (PG) includes a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 consists of a first sub-pixel (SP11), a second sub-pixel (SP12), a third sub-pixel (SP13) and a fourth sub-pixel (SP14) which are sequentially disposed. The second pixel P2 includes a first sub-pixel (SP21), a second sub-pixel (SP22), a third sub-pixel (SP23) and a fourth sub-pixel (SP24) which are sequentially disposed. The third pixel P3 includes a first sub-pixel (SP31), a second sub-pixel (SP32), a third sub-pixel (SP33) and a fourth sub-pixel (SP34) which are sequentially disposed. The fourth pixel P4 includes a first sub-pixel (SP41), a second sub-pixel (SP42), a third sub-pixel (SP43) and a fourth sub-pixel (SP44) which are sequentially disposed.

In a present example embodiment, the first sub-pixel of the first pixel SP11, the first sub-pixel of the second pixel SP 21, the first sub-pixel of the third pixel SP31 and the first sub-pixel of the fourth pixel SP41 have a same color, the red color R.

The sub-pixels SP11 and SP31 or SP21 and SP41, having the red color R are disposed in same column, so that crossing stripes of the red R may not be visible. Thus, display quality of the display apparatus may be improved.

The fourth sub-pixel of the first pixel SP14, the fourth sub-pixel of the second pixel SP 24, the fourth sub-pixel of the third pixel SP34 and the fourth sub-pixel of the fourth pixel SP44 have a same color, the blue color B.

The sub-pixels SP14 and SP34 or SP24 and SP44, having the blue color B are disposed in same column, so that crossing stripes of the blue B may not be visible. Thus, display quality of the display apparatus may be improved.

The second sub-pixel of the first pixel SP12 and the second sub-pixel of the fourth pixel SP42 have a same color, the green color G. The third sub-pixel of the first pixel SP13 and the third sub-pixel of the fourth pixel SP43 have a same color, the yellow color Y. The second sub-pixel of the second pixel SP22 and the second sub-pixel of the third pixel SP32 have a same color, the cyan color C. The third sub-pixel of the second pixel SP23 and the third sub-pixel of the third pixel SP33 have a same color, the magenta color M As described above, the pixels group PRU of FIG. 2D includes even numbers of sub-pixels of each color. Although a plurality of the pixels groups PRU are continuously disposed, the sub-pixels having a same color (true of GYMC) are disposed in different rows and spaced apart by 2 columns, so that the sub-pixels having same color are either adjacently disposed in same columns (true of B, R), or are spaced apart in farthest positions (true of GYMC). Thus, cross stripes are less visible comparing that the same color sub-pixels are nearly disposed, so that displaying quality may be improved.

Referring to FIG. 2E, the pixels group is substantially same as the pixels group of FIG. 2A, except for an arrangement of colors. Thus, any further detailed descriptions concerning the same elements will be omitted. More succinctly, in FIG. 2E the collection may be summarized as: 4*(B+G), 2*(R+Y+M+C)—where the vertically aligned pairs of blue (B) and green (G) subpixels come to be adjacent one to the other as BG stripe pairs when viewed in the context of neighboring and alike PRU's.

The pixels group (PG) of FIG. 2E in more detail consists of a first pixel (P1), a second pixel (P2), a third pixel (P3) and a fourth pixel (P4). The first pixel P1, the second pixel P2, the third pixel P3 and the fourth pixel P4 are arranged in a 2*2 matrix.

The first pixel P1 consists of a first sub-pixel (SP11), a second sub-pixel (SP12), a third sub-pixel (SP13) and a fourth sub-pixel (SP14) which are sequentially disposed. The second pixel P2 includes a first sub-pixel (SP21), a second sub-pixel (SP22), a third sub-pixel (SP23) and a fourth sub-pixel (SP24) which are sequentially disposed. The third pixel P3 includes a first sub-pixel (SP31), a second sub-pixel (SP32), a third sub-pixel (SP33) and a fourth sub-pixel (SP34) which are sequentially disposed. The fourth pixel P4 includes a first sub-pixel (SP41), a second sub-pixel (SP42), a third sub-pixel (SP43) and a fourth sub-pixel (SP44) which are sequentially disposed.

In a present example embodiment, the first sub-pixel of the first pixel SP11, the first sub-pixel of the second pixel SP 21, the first sub-pixel of the third pixel SP31 and the first sub-pixel of the fourth pixel SP41 have a same color, the green color G.

The sub-pixels SP11 and SP31 or SP21 and SP41, having the green color G are disposed in same column, so that crossing stripes of the green G may not be visible. Thus, display quality of the display apparatus may be improved.

The fourth sub-pixel of the first pixel SP14, the fourth sub-pixel of the second pixel SP 24, the fourth sub-pixel of the third pixel SP34 and the fourth sub-pixel of the fourth pixel SP44 have a same color, the blue color B.

The sub-pixels SP14 and SP34 or SP24 and SP44, having the blue color B are disposed in same columns, so that crossing stripes of the blue B may not be visible. Thus, display quality of the display apparatus may be improved.

The second sub-pixel of the first pixel SP12 and the second sub-pixel of the fourth pixel SP42 have a same color, the red color R. The third sub-pixel of the first pixel SP13 and the third sub-pixel of the fourth pixel SP43 have a same color, the cyan color C. The second sub-pixel of the second pixel SP22 and the second sub-pixel of the third pixel SP32 have a same color, the yellow color Y. The third sub-pixel of the second pixel SP23 and the third sub-pixel of the third pixel SP33 have a same color, the magenta color M As described above, the pixels group PRU of FIG. 2E includes even numbers of sub-pixels of each color. Although a plurality of the pixels groups PRU are continuously disposed over the display area of the corresponding display device, the sub-pixels having a same color are disposed in different rows and spaced apart by 2 columns (true for RYMC), so that the sub-pixels having a same color are either adjacently disposed in same columns (true for BG), or are spaced apart in farthest positions (true for RYMC). Thus, cross stripes are less visible comparing that the same color sub-pixels are nearly disposed, so that displaying quality may be improved.

Figure 3B:
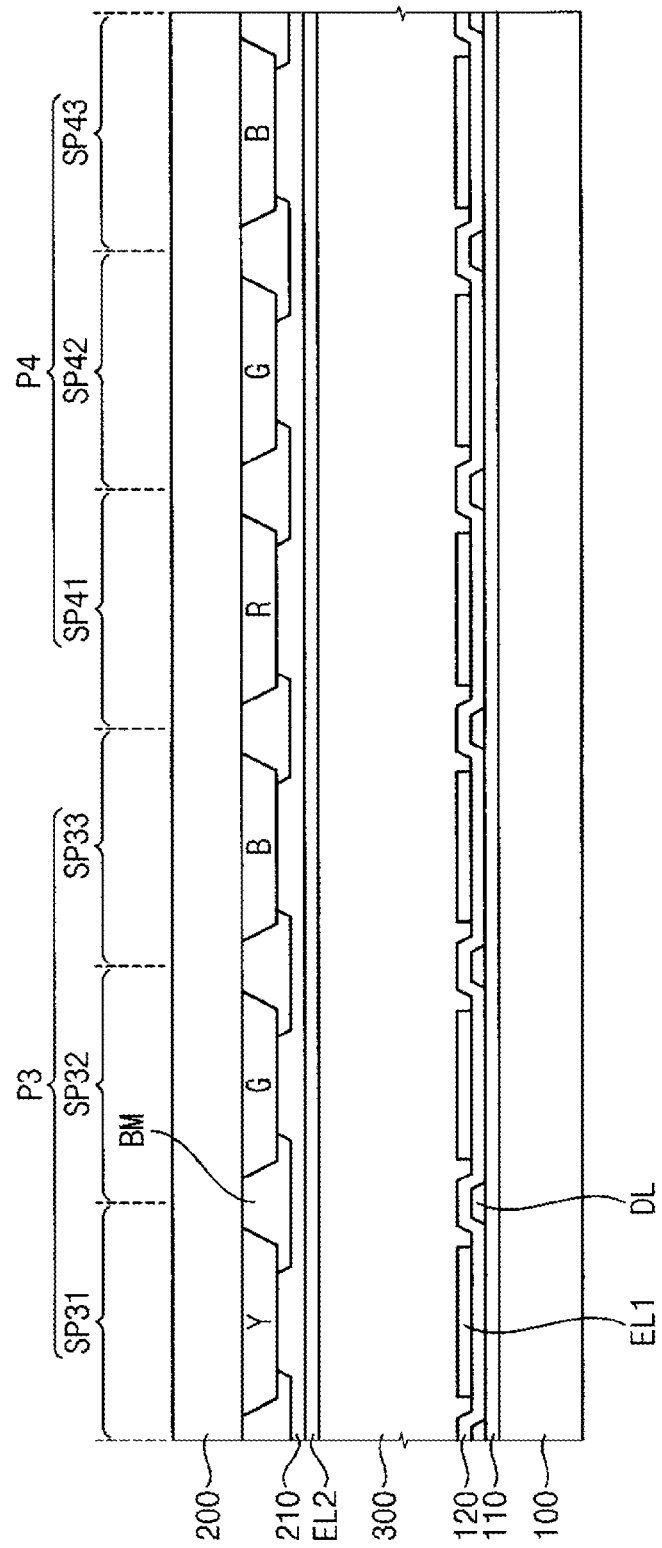
FIG. 3B is a cross-sectional view illustrating a second row of the pixels group of FIG. 1O.

FIG. 3A is a cross-sectional view illustrating a first row of the pixels group (PG) of FIG. 1O. FIG. 3B is a cross-sectional view illustrating a second row of the same pixels group of FIG. 1O.

Referring to FIGS. 3A and 3B, the illustrated pixels group is included repeatedly in a display panel so as to substantially tessellate the display area of that panel. The display panel (for the example case of an LCD type display) includes an array substrate, an opposite substrate facing the array substrate, and a liquid crystal layer 300 disposed between the array substrate and the opposite substrate.

The array substrate includes a first substrate 100, a gate insulating layer 110, a data line DL, a data insulating layer 120 and a first electrode EL1.

The first substrate 100 may be a transparent insulation substrate. For example, the first substrate 100 may be a glass substrate or a transparent plastic substrate. A gate electrode and a gate line are disposed on the first substrate 100.

The gate insulating layer 110 is disposed on the gate electrode and the gate line to insulatively cover the gate electrode and the gate line (not shown). The gate insulating layer 110 may include inorganic insulating materials, such as a silicon nitride (SiNx), a silicon oxide (SiOx) and etc.

The data line DL is disposed on the gate insulating layer 110. The data line DL may include copper (Cu). The data line DL is electrically connected to a source electrode. A drain electrode is spaced apart from the source electrode, and disposed on the insulating layer 110.

The data insulating layer 120 is disposed on the data line DL, the source electrode (of a corresponding transistor—not shown), and the drain electrode to insulate the data line DL, the source electrode, and the drain electrode The first electrode EL1 is disposed on the data insulation layer 120, and corresponds to a respective pixel area. The first electrode EL1 is electrically connected to the drain electrode (of the corresponding transistor, e.g., a TFT) through a contact hole which is formed through the data insulating layer 120. The first electrode EL1 may include transparent conductive material, such as indium tin oxide (ITO) or indium zinc oxide (IZO).

The source electrode and the drain electrode are connected by an active layer which overlaps the gate electrode. The active layer, the gate electrode, the drain electrode and the source electrode forms a thin film transistor (TFT, not shown).

The opposite substrate includes a second substrate 200, a color filter having R, G, B and Y subfilters, a black matrix BM, a protecting layer 210 and a second electrode EL2 (a.k.a. common electrode).

The second substrate 200 faces the first substrate 100. The second substrate 200 may be a transparent insulation substrate. For example, the second substrate 200 may be a glass substrate or a transparent plastic substrate.

The color subfilters R, G, B and Y are disposed under the second substrate 200. First to third sub-pixels of first to fourth sub-pixels SP11, SP12, SP13, SP21, SP22, SP23, SP31, SP32, SP33, SP41, SP42 and SP43 may have the colors: red R, green G, blue B, yellow Y, green G, blue B, yellow Y, green G, blue B, red R, green G and blue B, respectively.

The black matrix BM is disposed between the color subfilters, so that the black matrix BM divides each sub-pixel from the next and blocks leakage of light not controlled by a color subfilter and a respective TFT. The black matrix BM may partially overlaps with adjacent color subfilters. By controlling an area that the black matrix BM overlaps with the color filter, the aperture ratio of each sub-pixel may be adjusted. In one pixels group, the aperture ratio of the sub-pixel may be adjusted considering to brightness of each color. For example, in one pixels group embodiment, the relative ratio of areas that respective lights pass through, namely, of the areas of the red color R: of the green color G: of the blue color B: and of the yellow color Y may be 1.6:1.0:1.6:1.0 respectively.

The protecting layer 210 is disposed under the color filter and the black matrix BM to cover the color filter and the black matrix BM.

The second electrode EL2 is disposed under the protecting layer 210. The second electrode EL2 may include transparent conductive material, such as indium tin oxide (ITO) or indium zinc oxide (IZO).

Figure 4A:
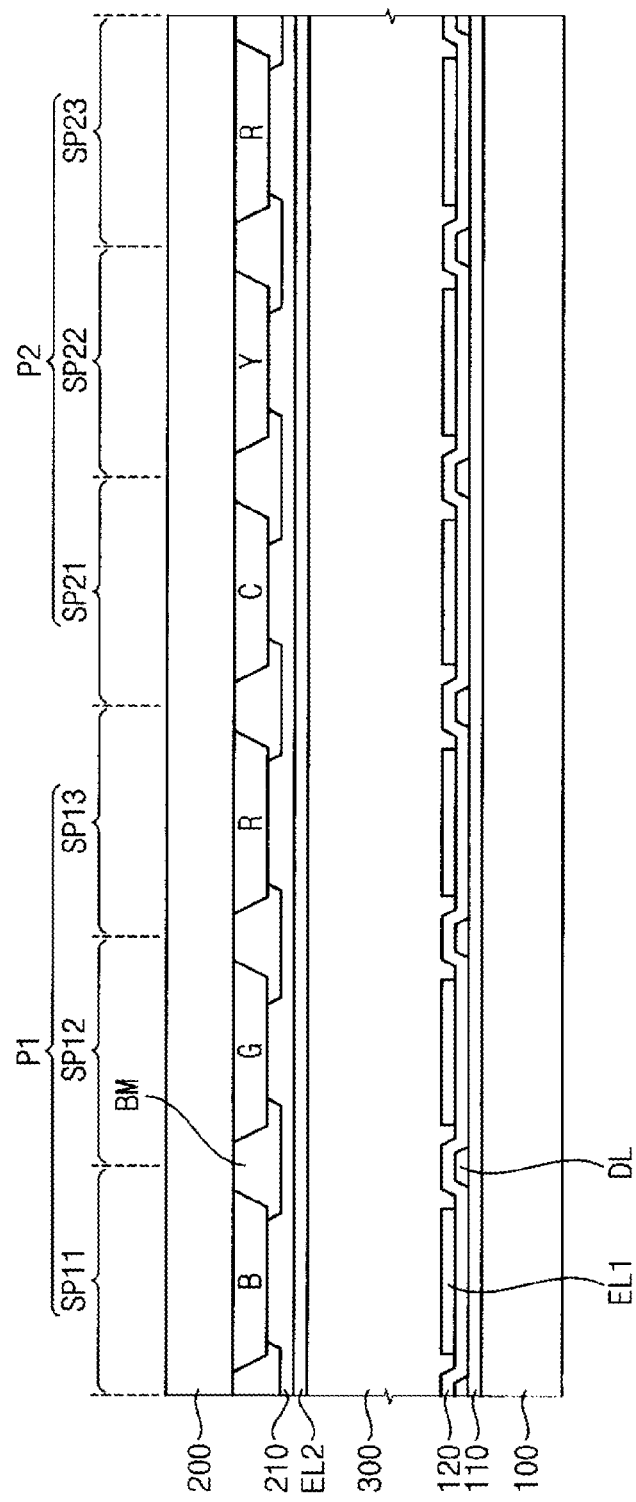
FIG. 4A is a cross-sectional view illustrating a first row of the pixels group of FIG. 1C.
Figure 4B:
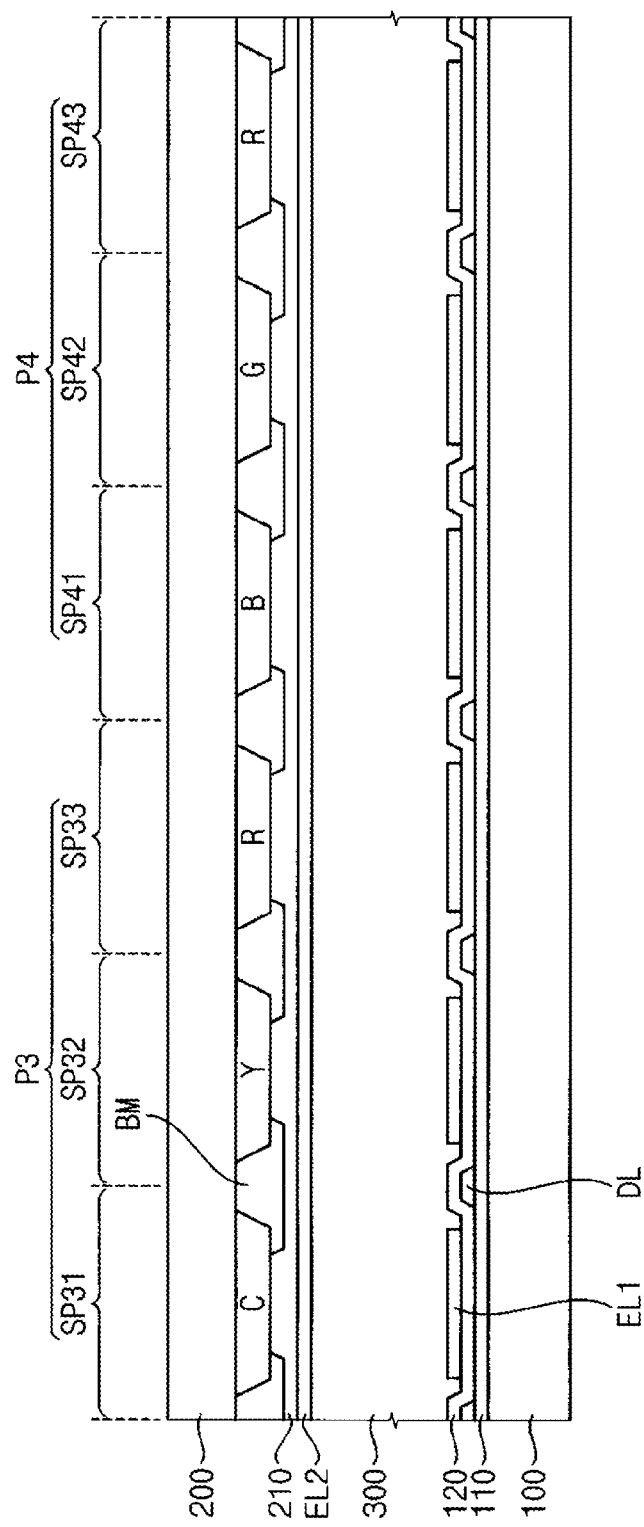
FIG. 4B is a cross-sectional view illustrating a second row of the pixels group of FIG. 1C.

FIG. 4A is a cross-sectional view illustrating a first row of the pixels group of FIG. 1C. FIG. 4B is a cross-sectional view illustrating a second row of the same pixels group of FIG. 1C.

Referring to FIGS. 4A and 4B, the pixels group is substantially same as the pixels group of FIGS. 3A and 3B, except for an arrangement of color filters and a black matrix BM. Thus, any further detailed descriptions concerning the same elements will be omitted.

The color subfilters R, G, B, C and Y are disposed under a second substrate 200. First to third sub-pixels of first to fourth sub-pixels SP11, SP12, SP13, SP21, SP22, SP23, SP31, SP32, SP33, SP41, SP42 and SP43 may have blue B, green G, red R, cyan C, yellow Y, red R, cyan C, yellow Y, red R, blue B, green G and red R, respectively.

The black matrix BM is disposed between the color filters, so that the black matrix BM divides each sub-pixel. The black matrix BM may partially overlaps with adjacent color filter. By controlling an area that the black matrix BM overlaps with the color filter, aperture ratio of each sub-pixel may be adjusted. In one pixels group, aperture ratio of the sub-pixel may be adjusted considering to brightness of each color. For example, in one pixels group, ratio of areas that light passes, the red R:the green G:the blue B:cyan C:the yellow Y may be 0.75:0.50:0.80:0.50:0.45.

Figure 5A:
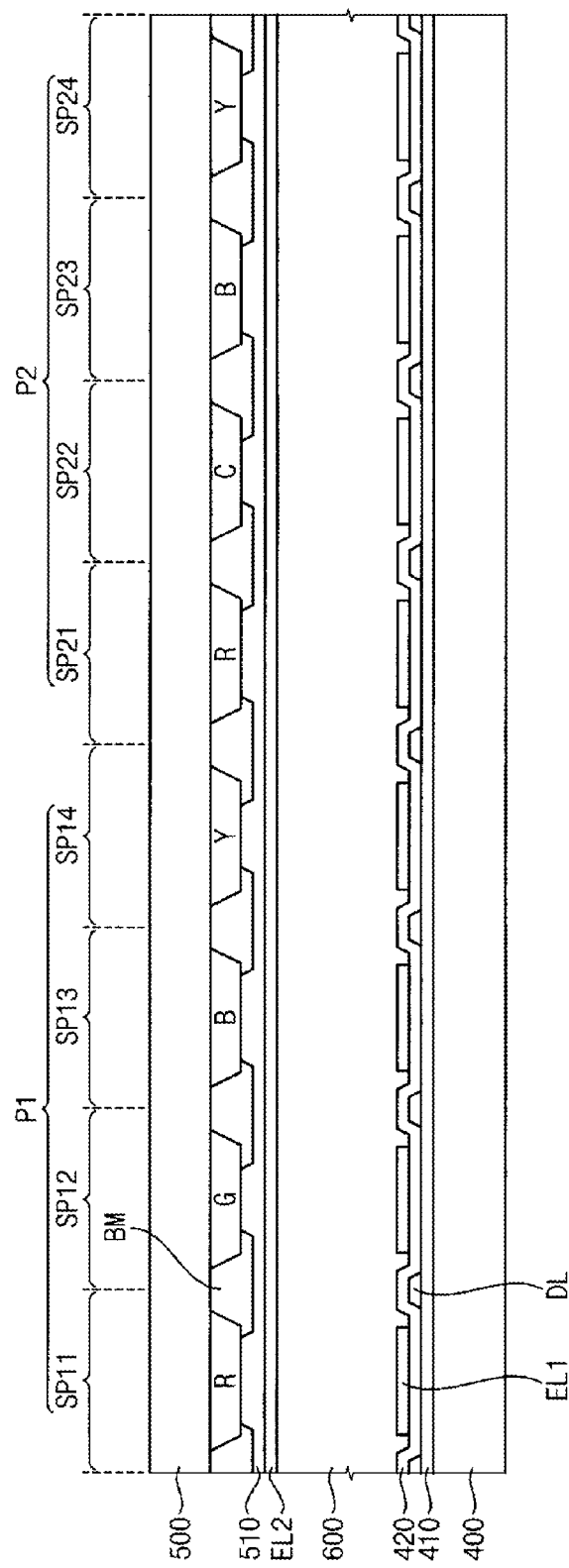
FIG. 5A is a cross-sectional view illustrating a first row of the pixels group of FIG. 2A.
Figure 5B:
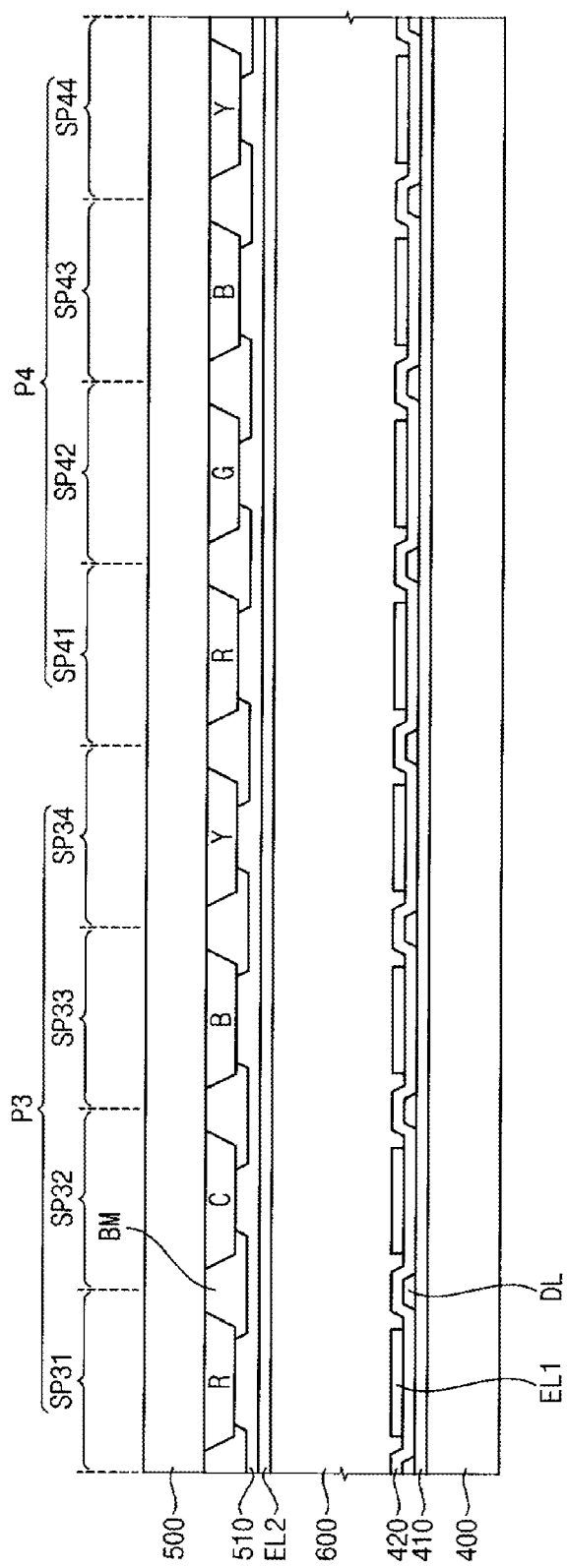
FIG. 5B is a cross-sectional view illustrating a second row of the pixels group of FIG. 2A.

FIG. 5A is a cross-sectional view illustrating a first row of the pixels group of FIG. 2A. FIG. 5B is a cross-sectional view illustrating a second row of the pixels group of FIG. 2A Referring to FIGS. 5A and 5B, the pixels group is included in a display panel. The display panel includes an array substrate, an opposite substrate facing the array substrate, and a liquid crystal layer 600 disposed between the array substrate and the opposite substrate.

The array substrate includes a first substrate 400, a gate insulating layer 410, a data line DL, a data insulating layer 420 and a first electrode EL1.

The first substrate 400 may be a transparent insulation substrate. For example, the first substrate 400 may be a glass substrate or a transparent plastic substrate. A gate electrode and a gate line are disposed on the first substrate 400.

The gate insulating layer 410 is disposed on the gate electrode and the gate line to insulate the gate electrode and the gate line. The gate insulating layer 410 may include inorganic insulating materials, such as a silicon nitride (SiNx), a silicon oxide (SiOx) and etc.

The data line DL is disposed on the gate insulating layer 410. The data line DL may include copper (Cu) and copper oxide (CuOx). The data line DL is electrically connected to a source electrode. A drain electrode is spaced apart from the source electrode, and disposed on the insulating layer 410.

The data insulating layer 420 is disposed on the data line DL, the source electrode, and the drain electrode to insulate the data line DL, the source electrode, and the drain electrode The first electrode EL1 is disposed on the data insulation layer 420, and corresponds to a pixel area. The first electrode EL1 is electrically connected to the drain electrode through a contact hole which is formed through the data insulating layer 420. The first electrode EL1 may include transparent conductive material, such as indium tin oxide (ITO) or indium zinc oxide (IZO).

The source electrode and the drain electrode are connected by an active layer which overlaps the gate electrode. The active layer, the gate electrode, the drain electrode and the source electrode forms a thin film transistor (TFT, not specifically shown).

The opposite substrate includes a second substrate 500, color filters R, G, B and Y, a black matrix BM, a protecting layer 510 and a second electrode EL2.

The second substrate 500 faces the first substrate 400. The second substrate 500 may be a transparent insulation substrate. For example, the second substrate 500 may be a glass substrate or a transparent plastic substrate The color filter R, G, B, C and Y is disposed under the second substrate 500. First to fourth sub-pixels of first to fourth sub-pixels SP11, SP12, SP13, SP14, SP21, SP22, SP23, SP24, SP31, SP32, SP33, SP34, SP41, SP42, SP43 and SP44 may have red R, green G, blue B, yellow Y, red R, cyan C, blue B, yellow Y, red R, cyan C, blue B, yellow Y, red R, green G, blue B, yellow Y, respectively.

The black matrix BM is disposed between the color filters, so that the black matrix BM divides each sub-pixel. The black matrix BM may partially overlaps with adjacent color filter. By controlling an area that the black matrix BM overlaps with the color filter, aperture ratio of each sub-pixel may be adjusted. In one pixels group, aperture ratio of the sub-pixel may be adjusted considering to brightness of each color. For example, in one pixels group, ratio of areas that light passes, the red R:the green G:the blue B:cyan C:the yellow Y may be 0.75:0.50:0.80:0.50:0.45.

The protecting layer 510 is disposed under the color filter and the black matrix BM to cover the color filter and the black matrix BM.

The second electrode EL2 is disposed under the protecting layer 510. The second electrode EL2 may include transparent conductive material, such as indium tin oxide (ITO) or indium zinc oxide (IZO).

Figure 6A:
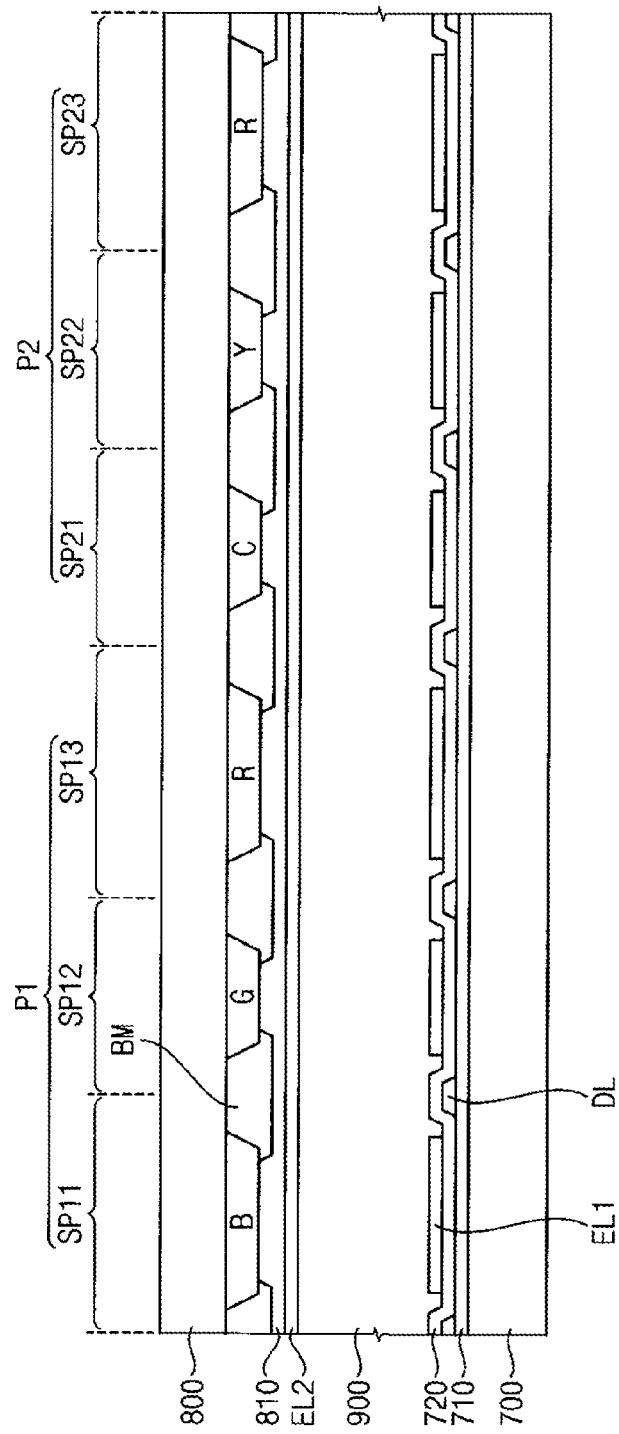
FIG. 6A is a cross-sectional view illustrating a first row of a pixels group having same color arrangement of FIG. 1O according to an example embodiment.

FIG. 6A is a cross-sectional view illustrating a first row of a pixels group having same color arrangement of FIG. 1O according to an example embodiment of the invention.

Figure 6B:
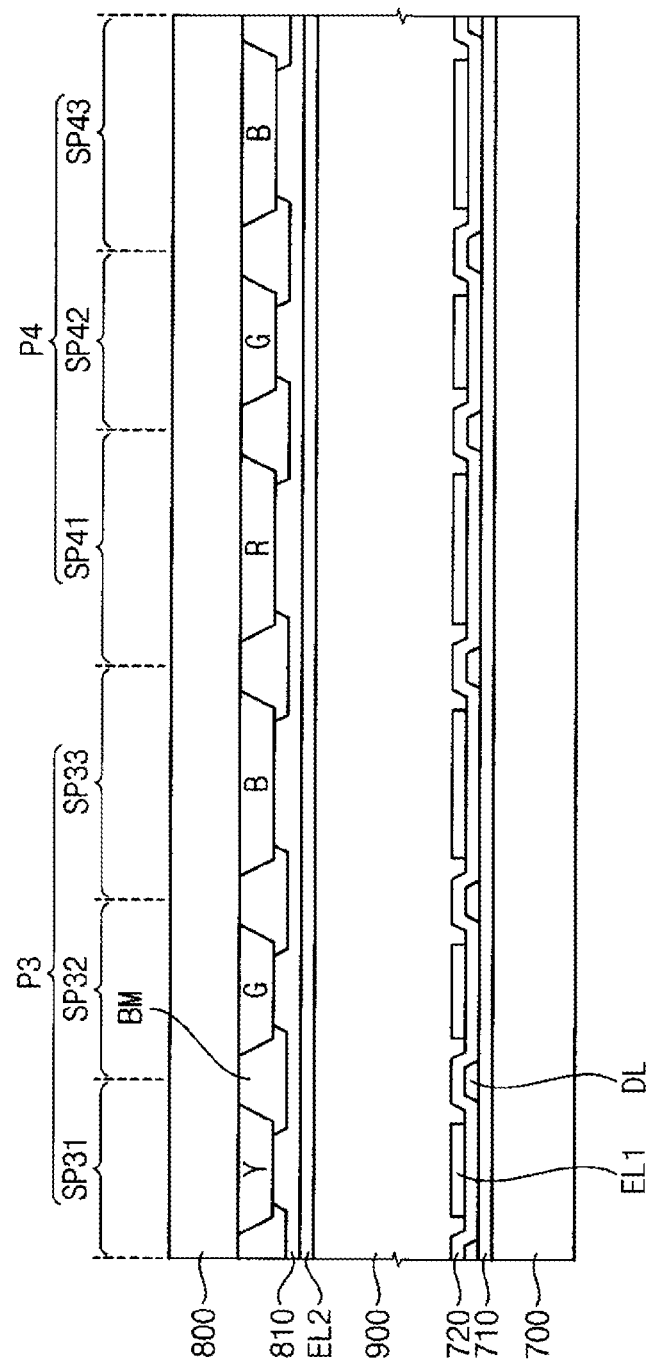
FIG. 6B is a cross-sectional view illustrating a second row of the pixels group of FIG. 6A.

FIG. 6B is a cross-sectional view illustrating a second row of the pixels group of FIG. 6A.

Referring to FIGS. 6A and 6B, the pixels group is substantially same as the pixels group of FIGS. 4A and 4B, except for a size of each sub-pixel and a black matrix BM. Thus, any further detailed descriptions concerning the same elements will be omitted.

The pixels group includes a display panel. The display panel includes an array substrate, an opposite substrate facing the array substrate, and a liquid crystal layer 900 disposed between the array substrate and the opposite substrate. The array substrate includes a first substrate 700, a gate insulating layer 710, a data line DL, a data insulating layer 720 and a first electrode EL1. The opposite substrate includes a second substrate 800, a color filter R, G, B, C and Y, a black matrix BM, a protecting layer 810 and a second electrode EL2.

The color filter R, G, B, C and Y is disposed under the second substrate 800. First to third sub-pixels of first to fourth sub-pixels SP11, SP12, SP13, SP21, SP22, SP23, SP31, SP32, SP33, SP41, SP42, and SP43 may have blue B, green G, red R, cyan C, yellow Y, red R, cyan C, yellow Y, red R, blue B, green G and red R, respectively. A size of each sub-pixel may be adjusted. In one pixels group, the size of the sub-pixel may be adjusted considering to brightness of each color. For example, in one pixels group, ratio of areas that light passes, the red R:the green G:the blue B:cyan C:the yellow Y may be 0.75:0.50:0.80:0.50:0.45.

The black matrix BM is disposed between the color filters, so that the black matrix BM divides each sub-pixel.

According to the present disclosure of invention therefore, a pixels group (PG) which tessellates the corresponding display area of a corresponding display device includes even numbers of sub-pixels of each of its multi-primary colors. Although a plurality of the pixels groups are continuously disposed in the display area, the sub-pixels having same a color are disposed either in different rows and spaced apart by 2 columns so as to be spaced apart in farthest positions, or adjacently disposed in same columns. Thus, cross stripes are less visible to the human visual system as compared to multi-primary color schemes in which same colored sub-pixels are more closely disposed, so that displaying quality may be improved.

In addition to the disclosed color arrangements, color displaying quality may be also improved by controlling a size of area of color filter of each of sub-pixels that light passes.

The foregoing is illustrative of the present disclosure of invention and is not to be construed as limiting thereof. Although a few example embodiments have been described, those skilled in the art will readily appreciate in light of the foregoing that many modifications are possible in the example embodiments without materially departing from the novel teachings and advantages of the present teachings. Accordingly, all such modifications are intended to be included within the scope of the present teachings. In the claims, means-plus-function clauses are intended to cover the structures described herein as performing the recited function and not only structural equivalents but also functionally equivalent structures. Therefore, it is to be understood that the foregoing is illustrative of the teachings and is not to be construed as limited to the specific example embodiments disclosed, and that modifications to the disclosed example embodiments, as well as other example embodiments, are intended to be included within the scope of the present disclosure.

What is claimed is:

1. A pixels group comprising:
    first to fourth pixels disposed in a 2 pixels by 2 pixels matrix; and
    each n-th one of the first to fourth pixels respectively comprising a first subpixel (SPn1), a second sub-pixel (SPn2), a third sub-pixel (SPn3), and a fourth sub-pixel (SPn4) respectively positioned in a same way in the respective pixel, where n is a positive integer less than 5,
    wherein:
    each of the first sub-pixels (SPn1) of the first to fourth pixels has a same first color,
    the second sub-pixel of the first pixel (SP12) and the second sub-pixel of the fourth pixel (SP42) have a same second color which is different from the first color,
    the third sub-pixel of the first pixel (SP13) and the third sub-pixel of the fourth pixel (SP43) have a same third color which is different from the first and second colors,
    the second sub-pixel of the second pixel (SP22) and the second sub-pixel of the third pixel (SP32) have a same fourth color which is different from the first through third colors,
    the third sub-pixel of the second pixel (SP23) and the third sub-pixel of the third pixel (SP33) have a same fifth color which is different from the first through fourth colors; and
    each of the respective fourth sub-pixels (SPn4) of the first to fourth pixels respectively has a yellow color which is different from the first through fifth colors.

2. The pixels group of claim 1, wherein the first to fifth colors are respective ones selected from the group consisting of red, green, blue, cyan and magenta.

3. The pixels group of claim 2, wherein the first color is red.

4. The pixels group of claim 3, wherein the respective first to third subpixels of the respective first to fourth pixels are sequentially disposed in a line in each respective pixel.

5. The pixels group of claim 1, wherein at least two of the sub-pixels among the first to third sub-pixels of the first to fourth pixels, have respective differently sized aperture areas for letting light pass through.

6. A pixels group comprising:
    first to fourth pixels disposed in a 2 pixels by 2 pixels matrix; and
    each n-th one of the first to fourth pixels respectively comprising a first subpixel (SPn1), a second subpixel (SPn2), a third sub-pixel (SPn3) and a fourth sub-pixel (SPn4) respectively positioned in a same way in the respective pixel, where n is a positive integer less than 5;
    wherein:
    each of the first sub-pixels (SPn1) of the first to fourth pixels has a same first color,
    the second sub-pixel of the first pixel (SP12) and the second sub-pixel of the fourth pixel (SP42) have a same second color which is different from the first color,
    the third sub-pixel of the first pixel (SP13) and the third sub-pixel of the fourth pixel (SP43) have a same third color which is different from the first and second colors,
    the second sub-pixel of the second pixel (SP22) and the second sub-pixel of the third pixel (SP32) have a same fourth color which is different from the first through third colors,
    the third sub-pixel of the second pixel (SP23) and the third sub-pixel of the third pixel (SP33) have a same fifth color which is different from the first through fourth colors, and
    each of the respective fourth sub-pixels (SPn4) of the first to fourth pixels respectively has a sixth color which is different from the first through fifth colors.

7. The pixels group of claim 6, wherein the first to sixth colors are respective ones selected from the group consisting of red, green, blue, cyan, yellow and magenta.

8. The pixels group of claim 6, wherein the first color is red, and the sixth color is yellow.

9. The pixels group of claim 8, wherein the respective first to fourth sub pixels of the respective first to fourth pixels are sequentially disposed in a line in each respective pixel.

10. A display panel comprising:
    an array substrate comprising a first substrate and a thin film transistor disposed on the first substrate; and
    an opposite substrate comprising a second substrate, color filters disposed under the second substrate and denoted as first to fifth color filters of corresponding colors, and a black matrix disposed between the color filters to compart the color filters so as to define a pixels group repeated across a display area of the display panel, the pixels group comprising:
    first to fourth pixels disposed in a 2 pixels by 2 pixels matrix; and
    each n-th one of the first to fourth pixels respectively comprising a first subpixel (SPn1), a second subpixel (SPn2), a third sub-pixel (SPn3), and a fourth sub-pixel (SPn4) respectively positioned in a same way in the respective pixel, where n is a positive integer less than 5,
    wherein:
    each of the first sub-pixels (SPn1) of the first to fourth pixels has a same first color, the second sub-pixel of the first pixel (SP12) and the second sub-pixel of the fourth pixel (SP42) have a same second color which is different from the first color, the third sub-pixel of the first pixel (SP13) and the third sub-pixel of the fourth pixel (SP43) have a same third color which is different from the first and second colors, the second sub-pixel of the second pixel (SP22) and the second sub-pixel of the third pixel (SP32) have a same fourth color which is different from the first through third colors, the third sub-pixel of the second pixel (SP23) and the third sub-pixel of the third pixel (SP33) have a same fifth color which is different from the first through fourth colors and each of the respective fourth sub-pixels (SPn4) of the first to fourth pixels respectively has a sixth color which is different from the first through fifth colors.

11. The display panel of claim 10, wherein the first to fifth colors are respective ones selected from the group consisting of red, green, blue, cyan, yellow and magenta.

12. The display panel of claim 11, wherein the black matrix partially overlaps with adjacent color filters, a size that the black matrix overlaps with the respective color filters is different according to the respective color of the color filter.

13. The display panel of claim 10, wherein the first to fifth colors are one of red, green, blue, cyan, yellow and magenta, the first to fifth colors are different from each other, and
each respective aperture size area of each of the color filters is different according to the respective color of the color filter.

14. The display panel of claim 13, wherein the ratio of the respective aperture size areas of the color filters red: green: blue: cyan: yellow is respectively about 0.75:0.5:0.8:0.5:0.45.

15. The display panel of claim 10, wherein the first to fifth colors are one of red, green, blue and yellow, and
ratio of size of area that light passes of the color filters red: green: blue: yellow is about 1.6:1:1.6:1.

* * * * *